(12) United States Patent
Shimatani et al.

(10) Patent No.: US 11,353,360 B2
(45) Date of Patent: Jun. 7, 2022

(54) ELECTROMAGNETIC WAVE DETECTOR, ELECTROMAGNETIC WAVE DETECTOR ARRAY, AND ELECTROMAGNETIC WAVE DETECTION METHOD

(71) Applicant: Mitsubishi Electric Corporation, Chiyoda-ku (JP)

(72) Inventors: Masaaki Shimatani, Chiyoda-ku (JP); Shimpei Ogawa, Chiyoda-ku (JP); Daisuke Fujisawa, Chiyoda-ku (JP); Satoshi Okuda, Chiyoda-ku (JP)

(73) Assignee: MITSUBISHI ELECTRIC CORPORATION, Tokyo (JP)

( * ) Notice: Subject to any disclaimer, the term of this patent is extended or adjusted under 35 U.S.C. 154(b) by 387 days.

(21) Appl. No.: 16/477,641

(22) PCT Filed: Oct. 19, 2017

(86) PCT No.: PCT/JP2017/037817
§ 371 (c)(1),
(2) Date: Jul. 12, 2019

(87) PCT Pub. No.: WO2018/173347
PCT Pub. Date: Sep. 27, 2018

(65) Prior Publication Data
US 2020/0264038 A1 Aug. 20, 2020

(30) Foreign Application Priority Data
Mar. 22, 2017 (JP) .............................. JP2017-055399

(51) Int. Cl.
*G01J 1/42* (2006.01)
*H01L 27/144* (2006.01)
(Continued)

(52) U.S. Cl.
CPC ........ *G01J 1/4228* (2013.01); *H01L 27/1443* (2013.01); *H01L 31/0232* (2013.01); *H01L 31/02164* (2013.01)

(58) Field of Classification Search
CPC .... G01J 2001/1631; G01J 1/1626; G01J 1/02; G01J 1/42; G01J 1/4228; H01L 31/112;
(Continued)

(56) References Cited

U.S. PATENT DOCUMENTS 4,902,884 A * 2/1990 Szabo .................. G01J 1/1626
250/205
9,184,270 B2 * 11/2015 Nourbakhsh ......... H01L 29/775
(Continued)

FOREIGN PATENT DOCUMENTS

JP 6-29567 A 2/1994
JP 2013-502735 A 1/2013
(Continued)

OTHER PUBLICATIONS

International Search Report dated Jan. 9, 2018 in PCT/JP2017/037817 filed on Oct. 19, 2017.

*Primary Examiner* — John R Lee
(74) *Attorney, Agent, or Firm* — Xsensus LLP

(57) ABSTRACT

This electromagnetic wave detector is provided with light reception graphene and reference graphene that are aligned on an insulating layer, first electrodes and second electrodes that are disposed so as to oppose each other and sandwich the light reception graphene and reference graphene, a gate electrode for applying a gate voltage to the light reception graphene and reference graphene, and a balanced circuit and detection circuit that are connected between the second electrodes. If electromagnetic waves are incident on the light reception graphene, photocarriers will be generated through in-band transition. If electromagnetic waves are incident on the reference graphene, photocarriers will not be generated (Continued)

because of the Pauli blocking effect. In a state where no electromagnetic waves are incident on the light reception graphene or reference graphene, the balanced circuit causes the first electrodes and second electrodes to have the same potential. The electrical signal between the second electrodes is detected in a state where electromagnetic waves are incident on the light reception graphene and reference graphene.

18 Claims, 22 Drawing Sheets

(51) Int. Cl.
*H01L 31/0216* (2014.01)
*H01L 31/0232* (2014.01)

(58) Field of Classification Search
CPC .................. H01L 31/10; H01L 27/144; H01L 2924/13088; H01L 29/66045; H01L 29/66015; H01L 29/1606
See application file for complete search history.

(56) References Cited

U.S. PATENT DOCUMENTS

| 9,599,770 | B2* | 3/2017 | Englund | G02B 6/29331 |
| 10,845,238 | B2* | 11/2020 | Korman | G01J 1/44 |
| 11,056,602 | B2* | 7/2021 | Ordonez | H01L 31/0352 |
| 2012/0293271 | A1* | 11/2012 | Nayfeh | H03B 5/1203 |
| | | | | 331/108 R |
| 2014/0299841 | A1* | 10/2014 | Nourbakhsh | H01L 29/513 |
| | | | | 257/29 |
| 2017/0323945 | A1* | 11/2017 | Haque | H01L 29/66045 |
| 2020/0132544 | A1* | 4/2020 | Koppens | H04N 5/374 |

FOREIGN PATENT DOCUMENTS

| JP | 2015-31666 A | 2/2015 |
| WO | WO 2011/023603 A2 | 3/2011 |

* cited by examiner (1) INTRABAND TRANSITION  (2) PAULI BLOCKING  (3) INTERBAND TRANSITION (a)

(b)

(c)

US 11,353,360 B2

ELECTROMAGNETIC WAVE DETECTOR, ELECTROMAGNETIC WAVE DETECTOR ARRAY, AND ELECTROMAGNETIC WAVE DETECTION METHOD

TECHNICAL FIELD

The present invention relates to an electromagnetic wave detector, an electromagnetic wave detector array, and an electromagnetic wave detection method, and more particularly to an electromagnetic wave detector, an electromagnetic wave detector array, and an electromagnetic wave detection method using graphene as a detection layer.

BACKGROUND ART

In a conventional electromagnetic wave detector, a semiconductor material is generally used as an electromagnetic wave detection layer, but since the semiconductor material has a predetermined band gap, only an electromagnetic wave having energy larger than the band gap can be detected. On the other hand, graphene with a zero or extremely small band gap is noted as a material for an electromagnetic wave detection layer of a next generation electromagnetic wave detector. For example, an electromagnetic wave detector in which a gate oxide film is provided on a substrate, a graphene channel layer is deposited thereon, and a source and a drain are formed at both ends of the channel layer is proposed (see, for example, Patent Documents 1 and 2).

PRIOR ART DOCUMENTS

Patent Documents

Patent Document 1: JP 2015-31666 A
Patent Document 2: JP 2013-502735 A

SUMMARY OF THE INVENTION

Problems to be Solved by the Invention

However, when an electromagnetic wave detection layer is formed of graphene alone, absorptivity of an electromagnetic wave becomes as low as about several percentages. Even if a detectable wavelength band is expanded, there is a problem that detection sensitivity is lowered. Further, graphene has an ambipolar property, so unlike an ordinary semiconductor material, OFF operation is difficult. When the graphene is used as an electromagnetic wave detector, there is also a problem that a dark current cannot be set to zero.

Therefore, a purpose of the present invention is to provide an electromagnetic wave detector, an electromagnetic wave detector array, and an electromagnetic wave detection method using, as a material for an electromagnetic wave detection layer, graphene having a wide detectable wavelength band of an electromagnetic wave and high detection sensitivity, and capable of performing OFF operation.

Means for Solving the Problems

A first aspect of the present invention is
an electromagnetic wave detector for converting an electromagnetic wave of a predetermined detection wavelength into an electric signal and detecting the electric signal, including:
a substrate;
an insulating layer provided on the substrate;
a light reception graphene and a reference graphene juxtaposed on the insulating layer;
a first electrode and a second electrode disposed facing each other with the light reception graphene and the reference graphene interposed,
the first electrode being one electrode electrically connected to both of the light reception graphene and the reference graphene at one ends,
the second electrode being two electrodes electrically connected to other ends of the light reception graphene and the reference graphene, respectively;
a gate electrode applying a gate voltage to the light reception graphene and the reference graphene;
a balance circuit connected between the two second electrodes; and
a detection circuit detecting electric signals between the two second electrodes,
wherein in the light reception graphene, carriers are doped, and when the electromagnetic wave having the detection wavelength is incident, photocarriers are generated by intraband transition,
in the reference graphene, carriers are doped, and when the electromagnetic wave having the detection wavelength is incident, no photocarrier is generated due to a Pauli blocking effect,
in a state in which the electromagnetic wave having the detection wavelength is not incident on the light reception graphene and the reference graphene, the balance circuit makes the first electrode and the second electrode have identical potential,
in a state in which the electromagnetic wave of the detection wavelength is incident on the light reception graphene and the reference graphene, the detection circuit detects electric signals between the second electrodes, and
electric signals in the state in which the electromagnetic wave having the detection wavelength is incident are output.

A second aspect of the present invention is
an electromagnetic wave detector converting an electromagnetic wave of a predetermined detection wavelength into an electric signal and detecting the electric signal, including:
a substrate;
an insulating layer provided on the substrate;
a graphene provided on the insulating layer;
a first electrode and a second electrode disposed facing each other with the graphene interposed, the first electrode being electrically connected to one end of the graphene, the second electrode being electrically connected to another end of the graphene;
a gate electrode applying a gate voltage to the graphene; and
a detection circuit detecting electric signals between the first electrode and the second electrode,
wherein the gate voltage includes
a first gate voltage that dopes carriers in the graphene such that photocarriers are generated by intraband transition when the electromagnetic wave having the detection wavelength is incident and
a second gate voltage that dopes carriers in the graphene such that no photocarrier is generated due to a Pauli blocking effect when the electromagnetic wave having the detection wavelength is incident, and further, when the electromagnetic wave having the detection wavelength is not incident, in a state in which the first gate voltage is applied and a state in which the second gate voltage is applied, the gate voltage is such that currents or voltages between the first electrode and the second electrode become identical, and when the electromagnetic wave having the detection wavelength is incident, a difference in the electric signals between the state in which the first gate voltage is applied and the state in which the second gate voltage is applied is output.

A third aspect of the present invention is an electromagnetic wave detection method, in which a first transistor having a channel of light reception graphene in which carriers are doped such that photocarriers are generated by intraband transition when irradiated with an electromagnetic wave having a predetermined detection wavelength, and a second transistor having a channel of a reference graphene in which carriers are doped such that no photocarrier is generated due to Pauli blocking when irradiated with the electromagnetic wave having the detection wavelength, the first and second transistors are connected in series, and electric signals at both ends thereof are detected, including:

applying a gate voltage to the first transistor and the second transistor in a state in which the electromagnetic wave having the detection wavelength is not incident on the light reception graphene and the reference graphene, and controlling a resistance value of the channel of the light reception graphene and a resistance value of the channel of the reference graphene so as to become identical;

detecting the electric signals in the state in which the electromagnetic wave having the detection wavelength is not incident on the light reception graphene and the reference graphene;

detecting the electrical signals in a state in which the electromagnetic wave having the detection wavelength is incident on the light reception graphene and the reference graphene; and obtaining and outputting a difference in the electric signals between the state in which the electromagnetic wave having the detection wavelength is incident and the state in which it is not incident.

The fourth aspect of the present invention is an electromagnetic wave detection method for detecting electric signals at both ends of a transistor in which a doping level of a channel of a graphene is controlled by a gate voltage, including:

controlling the gate voltage to a first gate voltage that dopes carriers in the graphene so that photocarriers are generated by intraband transition when an electromagnetic wave having a detection wavelength is incident and to a second gate voltage that dopes carriers in the graphene so that no photocarrier is generated due to a Pauli blocking effect when the electromagnetic wave having the detection wavelength is incident; further, equalizing currents or voltages between a first electrode and a second electrode in a state in which the first gate voltage is applied and a state in which the second gate voltage is applied when the electromagnetic wave having the detection wavelength is not incident; and obtaining a difference in the electric signals in a case of the first gate voltage and a difference in the electric signals in a case of the second gate voltage between a state in which the electromagnetic wave having the detection wavelength is incident and a state in which it is not incident, and obtaining and outputting a sum of the two differences.

Effects of the Invention

In the present invention, in an electromagnetic wave detector using graphene as an electromagnetic wave detection layer, it is possible to provide a high sensitivity electromagnetic wave detector in which a wavelength band of a detectable electromagnetic wave is wide, detection sensitivity is high, and OFF operation can be performed, and to provide a detection method using such an electromagnetic wave detector.

EMBODIMENTS OF THE INVENTION

Figure 1A:
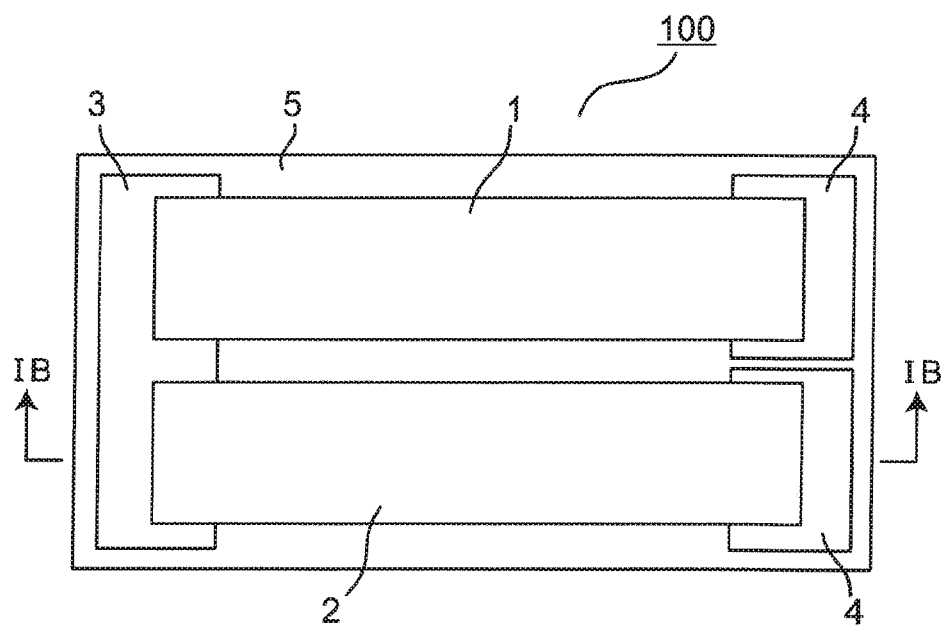
FIG. 1A is a top view of an electromagnetic wave detector according to a first embodiment of the present invention.

In embodiments of the present invention, an electromagnetic wave detector will be described using visible light or infrared light, but in addition to these, the present invention is also effective as a detector of, for example, ultraviolet light, near infrared light, and a radio wave region such as a terahertz (THz) wave or a microwave. Note that, in the embodiments of the present invention, these light and radio waves are generically described as electromagnetic waves.

In the embodiments of the present invention, the electromagnetic wave detector will be described using a structure having two electrodes of a source and a drain and a back gate electrode, but the present invention can be also applied to an electromagnetic wave detector having a four-terminal electrode structure or another electrode structure provided with a plurality of top gates and a back gate.

In the embodiments of the present invention, graphene is referred to as "light reception graphene" and "reference graphene". In other words, in operation, graphene in a state in which graphene where an electromagnetic wave having a detection wavelength is made incident does not perform interband transition or intraband transition due to a Pauli blocking effect is referred to as "reference graphene", and graphene in a state in which graphene where an electromagnetic wave having a detection wavelength is made incident performs carrier excitation by intraband transition is referred to as "light reception graphene". These may be in such a state at the time of operation, and a state before the operation does not matter.

In the embodiments of the present invention, a material for a contact layer provided on the graphene is described using terms such as an n-type and a p-type. These terms indicate that one has an electron donating property if it is the n-type and one has an electron withdrawing property if it is the p-type, for example. Further, deviation of charges is found in a whole molecule, and one in which electrons are dominant is called the n-type, and one in which holes are dominant is called the p-type. These include both organic and inorganic substances.

In addition, with regard to a surface plasmon resonance phenomenon or a plasmon resonance phenomenon that is an interaction between a metal surface and light, a phenomenon called a pseudo surface plasmon resonance meaning resonance applied to a metal surface other than a visible light range and a near infrared light range, or a phenomenon called a metamaterial or a plasmonic metamaterial meaning manipulation of a specific wavelength with a structure of a dimension smaller than the wavelength, these are not particularly distinguished by names, and are treated as an equivalent from an aspect of effects exerted by the phenomena. Here, these resonances are called surface plasmon resonance, plasmon resonance, or simply resonance.

Moreover, in each embodiment shown below, the same reference symbol denotes the same or corresponding portion, and detailed description of the portion is omitted by attaching the same reference symbol.

First Embodiment

Figure 1B:
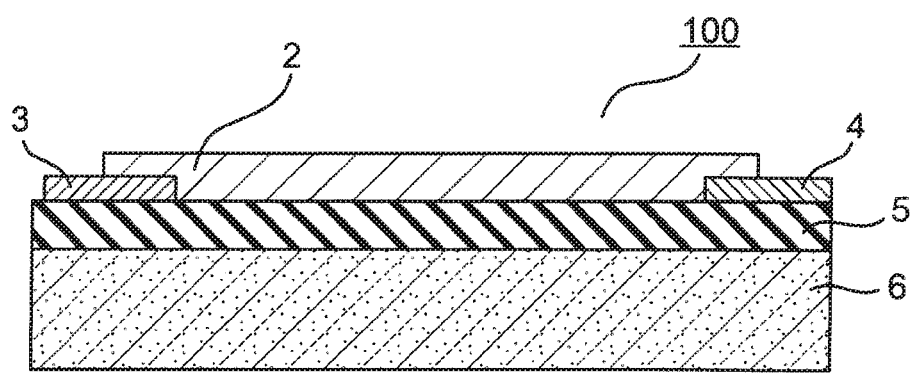
FIG. 1B is a sectional view of the electromagnetic wave detector of FIG. 1A as viewed in a IB-IB direction.

FIG. 1A is a top view of an electromagnetic wave detector according to a first embodiment of the present invention, which is generally represented by 100, and FIG. 1B is a sectional view of the electromagnetic wave detector 100 of FIG. 1A as viewed in an IB-IB direction. Further, FIG. 10 is a circuit diagram of the electromagnetic wave detector 100 according to the first embodiment of the present invention.

As shown in FIGS. 1A and 1B, the electromagnetic wave detector 100 includes a substrate 6. The substrate 6 holds the entire electromagnetic wave detector 100, and is made of a semiconductor material such as silicon. For example, a high resistance silicon substrate or a substrate having a thermal oxide film formed thereon to enhance insulation is used. Alternatively, as described later, in a case where the substrate 6 is used as a back gate, a doped silicon substrate may be used.

An insulating layer 5 made of, for example, silicon oxide ($SiO_2$), silicon nitride (SiN), aluminum oxide, nickel oxide, or boron nitride (BN) is provided on the substrate 6. The boron nitride is preferable as a base film of graphene without disturbing performance of the graphene such as electron mobility because an atomic arrangement thereof is similar to a structure of the graphene and therefore charge transfer in the graphene is not impeded even if it contacts the graphene. Note that when the substrate 6 is a substrate having a thermal oxide film on a surface, the thermal oxide film may also serve as the insulating layer 5.

A light reception graphene 1 and a reference graphene 2 are juxtaposed on the insulating layer 5. As described above, the light reception graphene 1 refers to graphene in a state in which carrier excitation is performed by intraband transition when an electromagnetic wave of a detection wavelength is made incident, and the reference graphene 2 refers to graphene in a state in which no interband transition or intraband transition is performed due to the Pauli blocking effect when an electromagnetic wave of a detection wavelength is made incident.

The light reception graphene 1 is doped so that photocarriers are generated by intraband transition when irradiated with an electromagnetic wave having a predetermined detection wavelength. On the other hand, the reference graphene is doped such that no photocarrier is generated by intraband transition or interband transition due to the Pauli blocking when irradiated with an electromagnetic wave having a predetermined detection wavelength. For the doping, an electrical method of applying a voltage or a chemical method of immersing in a solution is used.

The light reception graphene 1 and the reference graphene 2 are formed of a single layer or two or more layers of graphene. When the number of laminated graphene layers is increased, a light absorptivity increases, and sensitivity of the electromagnetic wave detector 100 increases. Note that the graphene is a monoatomic layer of a two-dimensional carbon crystal, and a thickness of single-layer graphene is as thin as 0.34 nm which is equivalent to one carbon atom. The graphene has carbon atoms in each chain arranged in a hexagonal shape.

In a case where the light reception graphene 1 and the reference graphene 2 are formed of a laminated structure of two or more layers of graphene, in any two layers of graphene included in the laminated structure, directions of lattice vectors of hexagonal lattices may not match, that is, the directions of the lattice vectors may be deviated. In addition, a laminated structure in which lattice vectors coincide completely may be used. In particular, when two or more layers of graphene are laminated, a band gap is formed, so that a wavelength selection effect can be obtained.

Further, in a case of using nanoribbon-like graphene, a structure in which a graphene nanoribbon alone or a plurality of graphene nanoribbons is arranged may be used. The light reception graphene 1 and the reference graphene 2 may be non-doped before operation, and may be p-type or n-type doped.

In addition, on surfaces of the light reception graphene 1 and the reference graphene 2, one-dimensional or two-dimensional periodic recesses or protrusions may be provided. When the periodic recesses or protrusions are provided, an electromagnetic wave of a specific wavelength corresponding to a periodic structure can be absorbed. Since graphene is metalloid, absorption occurs by plasmon resonance similar to metal in principle. The recess may be a hole that penetrates the graphene. When the graphene is formed of a single layer, the recess is a hole penetrating the graphene. In a case where the graphene is formed of a plurality of layers, the recess does not penetrate the graphene if it is a hole that penetrates only any of the layers. In addition, in a case of a hole that penetrates all of the plurality of layers, the recess penetrates the graphene.

When the recesses are two-dimensionally arranged, a periodic arrangement may be any periodic arrangement such as a square lattice or a triangular lattice. Further, a shape of the recess when viewed from above may be a recess having any shape, such as a cylinder, a prism, a triangular prism, a quadrangular prism, or an elliptic cylinder. However, if the shape of the recess viewed from the top has asymmetry, such as a triangle, an ellipse, or a rectangle, light absorbed by the graphene has polarization dependence, so that an electromagnetic wave detector that detects only specific polarized light can be formed. On the other hand, when the recesses are one-dimensionally arranged, the periodic arrangement may be, for example, one-dimensional grooves arranged in parallel.

As described above, when the shape of the recess has the asymmetry such as the ellipse or the rectangle, or when the arrangement of the recesses has the asymmetry such as the one-dimensional periodic arrangement, polarization dependence occurs in light detection. It is also applicable to polarization imaging. In the polarization imaging, it is possible to distinguish a boundary between objects, artifacts, and natural objects. Conventionally, it is necessary to attach another part such as a polarizer or a polarization filter to an electromagnetic wave detector, so that there are problems such as an increase in size of the detector and system complexity. However, in the electromagnetic wave detector using graphene, a detector for detecting specific polarized light can be realized simply by processing the graphene into an asymmetric shape. Therefore, it is not necessary to separately provide the polarizer, the polarization filter, etc., and there are significant advantages such as miniaturization of a system, reduction in the number of parts, elimination of loss of light passing through the polarizer and the filter.

By forming such a periodic structure on the graphene, only an electromagnetic wave having a specific resonance wavelength can be absorbed by the surface of the graphene. In other words, in the electromagnetic wave detector 100, only the electromagnetic wave having the specific resonance wavelength can be strongly detected, and detection sensitivity of a specific wavelength can be enhanced. Higher wavelength sensitivity can be obtained by combining with the electromagnetic wave detector 100 according to the first embodiment using the Pauli blocking, so that higher sensitivity can be achieved.

Here, the case where the periodic recesses are formed on the surface of the graphene has been described, but a pattern in which periodic protrusions are formed may be used.

On the insulating layer 5, an electrode 3 connecting the light reception graphene 1 and the reference graphene 2 in series, and two electrodes 4 facing the electrode 3 with the light reception graphene 1 and the reference graphene 2 interposed therebetween are provided. The electrodes 3 and 4 are connected to both ends of the light reception graphene 1 and the reference graphene 2. The electrodes 3 and 4 are formed of, for example, a metal such as Au, Ag, Cu, Al, Ni, Cr, or Pd. An adhesion film (not shown) made of Cr or Ti may be formed between the electrodes 3 and 4 and the insulating layer 5 thereunder. Shapes of the electrodes 3 and 4 are not particularly limited as long as size and thickness thereof are large enough to output an electric signal. In addition, the electrode 3 (for example, a source electrode) and the electrode 4 (for example, a drain electrode) may be formed of different metals.

The graphene is doped by a difference in work function of metal and graphene depending on a type of metal in contact. Thereby, the Fermi level of the graphene moves, or contact resistance is different. Therefore, when the electrodes 3 and 4 are formed of different metals, an energy gap is different between the source and the drain. Therefore, when irradiated with light, bias is generated between the electrodes 3 and 4 by generated carriers, a photocurrent is increased, and sensitivity can be improved. In the first embodiment of the present invention, for simplification, a case where the pair of electrodes 3 and 4 is formed on the light reception graphene 1 and the reference graphene 2 respectively and electric resistance therebetween is detected has been described as an example. Other structures such as a transistor structure may be applied.

Also, periodic recesses or protrusions may be provided on surfaces of the electrodes 3 and 4. Plasmon resonance occurs when the periodic recesses or protrusions are provided. The recesses are, for example, cylindrical recesses arranged at predetermined intervals in two dimensions. The arrangement may be any periodic arrangement such as a square lattice or a triangular lattice. Instead of the cylinder, a recess having another shape such as a prism, a triangular prism, a quadrangular prism, or an elliptic cylinder may be used. Further, the recesses may be one-dimensional grooves arranged in parallel. Even if these recesses pass through or do not pass through the electrodes 3 and 4, a pattern design for detecting a target wavelength may be appropriately performed. Providing such periodic recesses on the surfaces of the electrodes 3 and 4 causes plasmon resonance strongly localized to a metal surface at a specific wavelength. A material for the electrodes 3 and 4 may be any metal as long as surface plasmon resonance occurs. For example, Au, Ag, Al or the like is used. Here, a case where the periodic recesses are formed on the surfaces of the electrodes 3 and 4 has been described, but the same effect can be obtained even if the periodic protrusions are formed.

Here, a resonance wavelength of the plasmon resonance is determined depending on the periodic structure and the size of the recess or protrusion. By forming such a periodic structure on the electrodes 3 and 4, only an electromagnetic wave having a specific resonance wavelength can be absorbed by the electrode surfaces. In other words, in the electromagnetic wave detector 100, only the electromagnetic wave having the specific resonance wavelength can be strongly detected, and detection sensitivity of the specific wavelength can be enhanced.

Figure 1C:
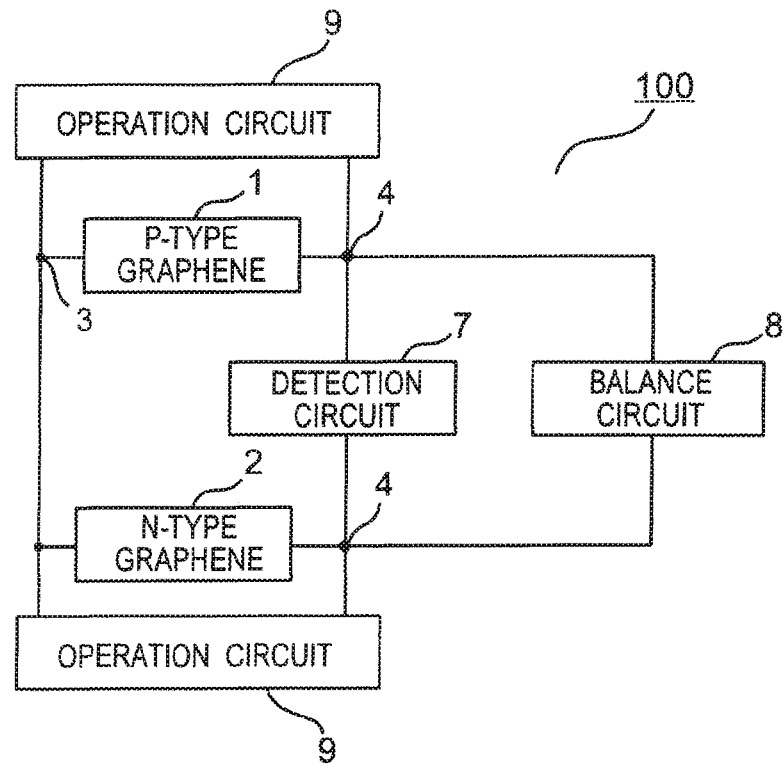
FIG. 1C is a circuit diagram of the electromagnetic wave detector according to the first embodiment of the present invention.

As shown in FIG. 1C, the electromagnetic wave detector 100 has a detection circuit 7, a balance circuit 8, and operation circuits 9 as peripheral circuits. The operation circuits 9 apply external bias to the light reception graphene 1 and the reference graphene 2 via the electrodes 3 and 4. Further, between the two electrodes 4, the detection circuit 7 detects a potential difference between the light reception graphene 1 and the reference graphene 2. The balance circuit 8 is provided to balance the light reception graphene 1 and the reference graphene 2.

Figure 2A:
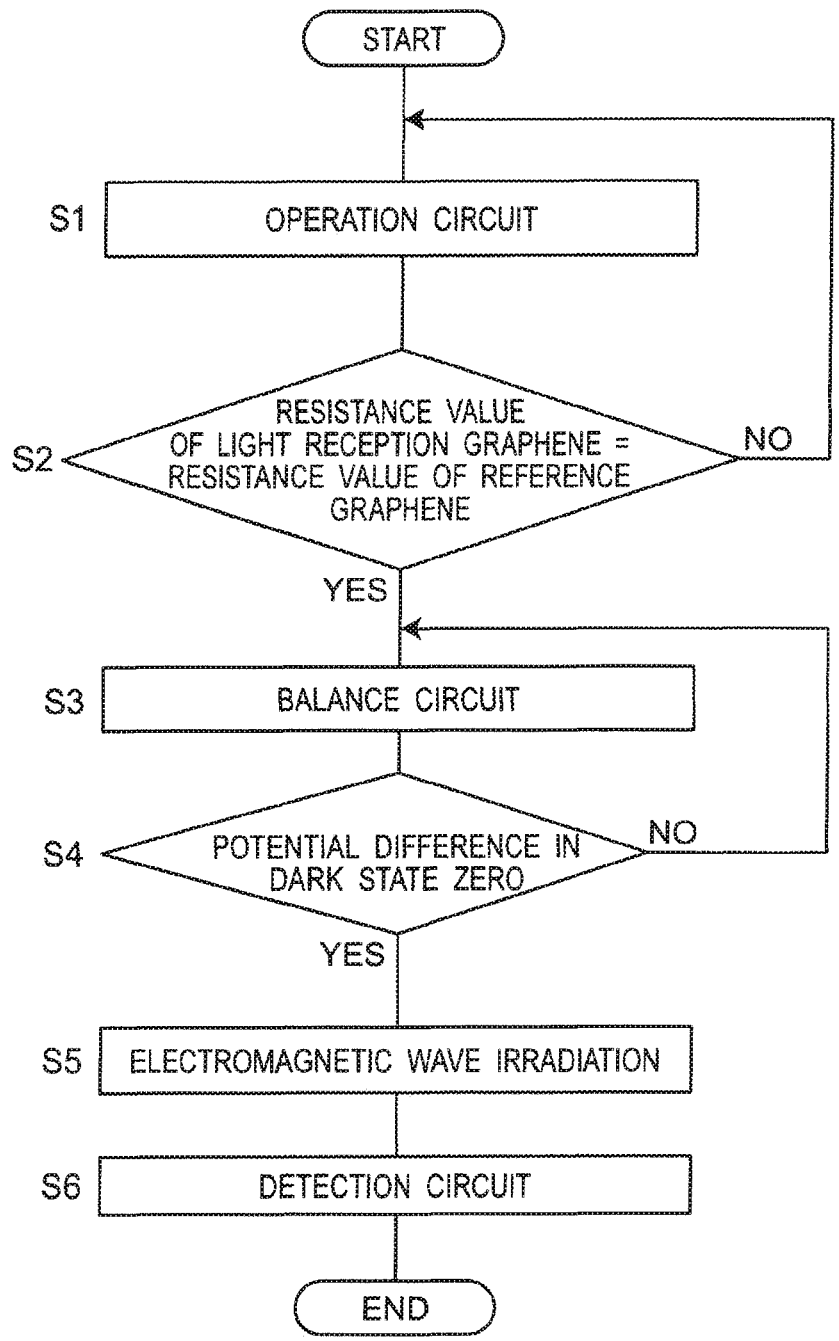
FIG. 2A is a flowchart of operation of the electromagnetic wave detector according to the first embodiment of the present invention.
Figure 2B:
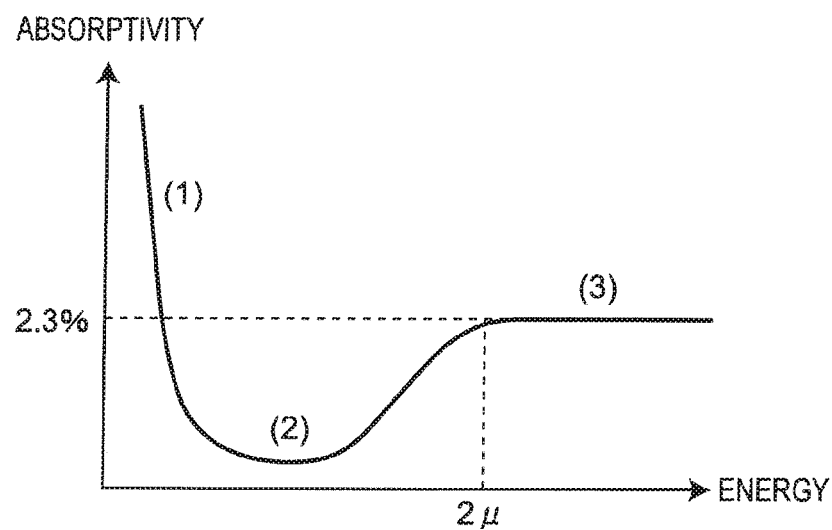
FIG. 2B is a diagram showing a principle of a Pauli blocking effect on the electromagnetic wave detector according to the first embodiment of the present invention.
Figure 2B:
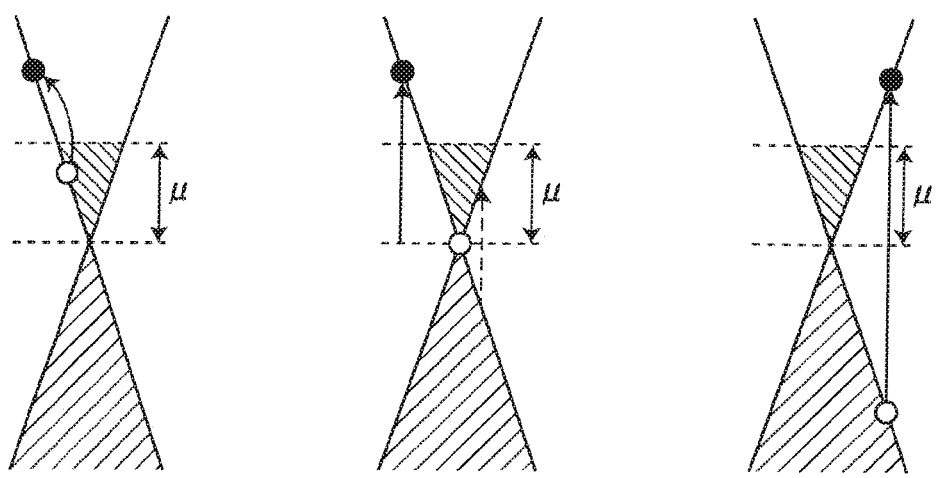
Figure 2C:
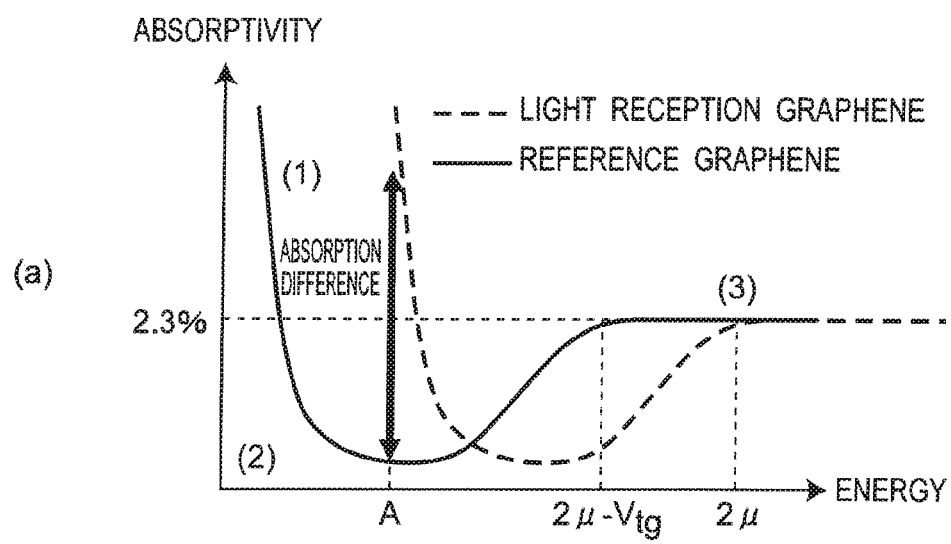
FIG. 2C is a diagram showing an operation principle of the electromagnetic wave detector according to the first embodiment of the present invention.
Figure 2C:
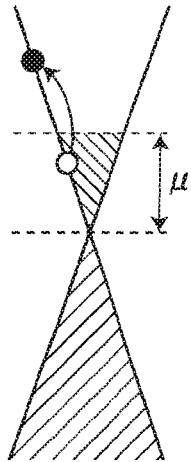
Figure 2C:
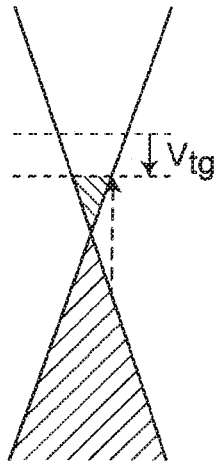

FIG. 2A is a flow chart of operation of the electromagnetic wave detector 100, FIG. 2S is a diagram showing a principle of the Pauli blocking effect on the electromagnetic wave detector 100, and FIG. 2C is a diagram showing an operation principle of the electromagnetic wave detector 100. In FIGS. 2B and 2C, a horizontal axis represents energy, and a vertical axis represents absorptivity of graphene.

Here, the Pauli blocking effect is a physical phenomenon that occurs in graphene in an infrared wavelength range. For example, it is assumed that the Fermi level of graphene is shifted by p with respect to a Dirac point (an intersection in a band diagram (2): an intersection of a so-called valence band and a conduction band) by doping. As shown in the lower band diagram of FIG. 2B, when wavelength energy of an incident electromagnetic wave is larger than 2μ, (3) interband transition occurs and the graphene absorbs the electromagnetic wave. However, for example, as in (2), when a wavelength of the incident electromagnetic wave becomes longer and the wavelength energy thereof becomes smaller than 2μ, the interband transition of the graphene is prevented by the Pauli blocking (indicated by a broken line in (2)), and absorptivity decreases. This is called the Pauli blocking effect. Furthermore, when the wavelength of the incident electromagnetic wave becomes longer, electrons in the graphene perform intraband transition (1), and the absorptivity increases. In an electromagnetic wave detection method according to the first embodiment of the present invention, a difference in absorption amount between the intraband transition state (1) and the Pauli blocking state (2) is detected.

Note that, here, as shown in FIG. 2B, a region where the energy is 2μ or more and the absorptivity of graphene is a constant value (2.3%) is called a "(3) interband transition" region, a region where the energy is smaller than 2μ and the absorptivity is smaller than the constant value (2.3%) is called a "(2) Pauli blocking" region, and a region where the energy is further decreased and the absorptivity is the constant value (2.3%) or more is called a "(1) intraband transition" region.

Specifically, as shown in FIG. 2C, a gate voltage Vtg is applied to the reference graphene 2 of the electromagnetic wave detector 100 electrically and wave-chemically to dope the reference graphene 2, thereby shifting the Fermi level as shown in (c). At this time, as shown in (a), a graph showing a relationship between energy and absorptivity of the reference graphene 2, to which the gate voltage is applied, is also shifted as shown by a solid line. As a result, for example, when an electromagnetic wave of wavelength energy A is made incident on the electromagnetic wave detector 100, the electromagnetic wave is absorbed by (1) the intraband transition in the light reception graphene 1, while the electromagnetic wave is not absorbed due to (2) the Pauli blocking in the reference graphene 2. In other words, as shown in (a), an absorption difference of absorptivity occurs between the light reception graphene 1 and the reference graphene 2. By detecting this absorption difference, the electromagnetic wave of the wavelength energy A can be detected with high sensitivity.

Although the reference graphene 2 is doped to shift the Fermi level by applying the gate voltage in the first embodiment, a chemical doping method may be used. Further, by controlling a doping level of each of the light reception graphene 1 and the reference graphene 2, highly sensitive detection can be made for an electromagnetic wave of any wavelength energy.

Next, the operation of the electromagnetic wave detector 100 will be described with reference to FIG. 2A showing a flowchart of the operation of the electromagnetic wave detector 100.

First, a voltage $V_d$ is applied between the two electrodes 3 and 4 from the two operation circuits 9 shown in FIG. 1C (S1). Thereby, resistance values inside the light reception graphene 1 and the reference graphene 2 change, and an amount of current $I_d$ flowing between the electrodes 3 and 4 changes. The change in the amount of current $I_d$ is adjusted, and in a dark state, applied bias is adjusted so that the resistance values of the light reception graphene 1 and the reference graphene 2 become the same (S2). The applied bias may be a voltage or a current, and it is enough if the resistance values of the light reception graphene 1 and the reference graphene 2 are the same. Alternatively, the resistance value may be adjusted by applying a gate voltage with a back surface of the substrate 6 as a back gate terminal. In this case, by applying the voltage to the back surface of the substrate 6, a larger electric field can be generated in the light reception graphene 1, and carriers generated by incidence of an electromagnetic wave can be detected with high efficiency. However, when the resistance value is changed by applying the gate voltage, it is necessary to be careful because the absorptivity of graphene may also be changed due to influence of doping by the electric field.

Figure 1D:
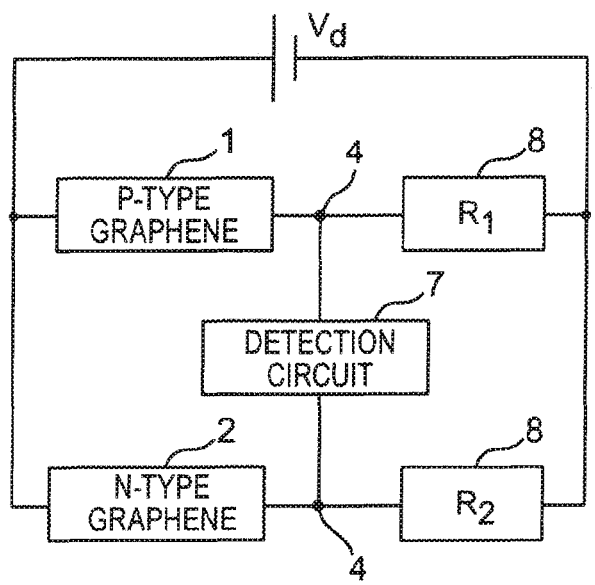
FIG. 1D is a circuit diagram of the electromagnetic wave detector according to the first embodiment of the present invention.

Next, using the balance circuit 8 (S3), resistance of the circuit is adjusted so that a potential difference in the dark state where the electromagnetic wave is not made incident becomes zero between terminals of the two electrodes 4 (S4). For example, as shown in FIG. 1D, the balance circuit 8 is configured by a bridge circuit or the like in which two resistance elements R1 and R2 are connected to balance the light reception graphene 1 and the reference graphene 2. The resistance elements R1 and R2 are formed of a silicon semiconductor thin film transistor, a thin film resistance element, a two-dimensional material transistor element, a transistor element using light reception graphene, a transistor element using reference graphene, or the like. When the transistors using the light reception graphene 1 and the reference graphene 2 are used as the resistance elements R1 and R2, it is possible to cancel time change and temperature change of the light reception graphene 1 and the reference graphene 2 at the time of balance. In addition, the reference graphene 2 may be mere graphene if a light shielding member is provided so as not to be affected by a detection wavelength.

The balance circuit 8 adjusts the resistance of the circuit so that the potential difference in the dark state becomes zero between the terminals of the two electrodes 4 (S4). At this time, the resistance of the light reception graphene 1 or the reference graphene 2 may be changed and adjusted using the operation circuit 9, or the operation circuit 9 may be set as a constant voltage and resistance values of the resistance elements connected as the balance circuit 8 may be changed and adjusted. Alternatively, both of the operation circuit 9 and the balance circuit 8 may be changed and adjusted. The adjustment in the operation circuit 9 and the balance circuit 8 may be performed before or after, as long as the potential difference between the terminals of the electrodes 4 is zero at an operation gate voltage in the dark state before electromagnetic wave irradiation. Further, a voltage in the dark state may be set to zero when an electric signal to be detected is output as a voltage, and a current in the dark state may be set to zero when output as a current.

The Fermi levels of the light reception graphene 1 and the reference graphene 2 are previously shifted by energy p with respect to the Dirac point due to doping. In this state, the electromagnetic wave of the wavelength to be detected by the electromagnetic wave detector 100 is not absorbed due to the Pauli blocking (for example, the electromagnetic wave of the energy A shown in FIG. 2C). Further, the gate voltage Vtg is applied to the light reception graphene 1 so that intraband transition occurs in the light reception graphene 1. In this state, the light reception graphene 1 and the reference graphene 2 are irradiated with an electromagnetic wave (S5).

In a state of being irradiated with the electromagnetic wave of the predetermined detection wavelength, electric signals are detected between the two electrodes 4 using the detection circuit (S6).

For example, a voltmeter when detecting a voltage, or an ammeter when detecting a current may be used for the detection circuit 7. Further, a differential response can be further amplified and obtained by using a differential amplifier circuit such as an operational amplifier. Alternatively, an output amplifier circuit using graphene may be used as the amplifier circuit. As a result, the operation becomes faster as compared with the output amplifier circuit formed of a silicon-based semiconductor material, and a high performance electromagnetic wave detector can be realized. In addition, by using graphene for the peripheral circuits such as the detection circuit, high-speed readout and simplification of a manufacturing process are possible. Furthermore, when the temperature change and the time change occur in the light reception graphene 1 and the reference graphene 2, since these can be also canceled when the difference is output, noise can be reduced.

Next, a method of manufacturing the electromagnetic wave detector 100 will be briefly described. The method of manufacturing the electromagnetic wave detector 100 includes the following steps 1 to 5.

Step 1: The flat substrate 6 made of silicon or the like is prepared.

Step 2: The insulating layer 5 is formed on the substrate 6. For example, when the substrate 6 is made of silicon, the insulating layer 5 may be made of thermally oxidized silicon oxide ($SiO_2$). Alternatively, another insulating film may be formed by CVD or sputtering.

Step 3: The electrodes 3 and 4 made of a metal such as Au, Ag, Cu, Al, Ni, or Cr are formed. At this time, an adhesion film of Cr, Ti, or the like may be formed between the insulating layer 5 and the electrodes 3 and 4 in order to improve adhesion to the insulating layer 5 thereunder. The electrodes 3 and 4 are formed by forming a resist mask using photolithography or EB lithography and then depositing a metal layer of Au, Ag, Cu, Al, Ni, Cr, or the like by vapor deposition, sputtering, or the like. Thereafter, the electrodes 3 and 4 are formed by removing the resist mask. Generally, it is a method called lift-off. Alternatively, a metal film may be formed first on the insulating layer 5, a resist mask may be formed by photolithography, and the electrodes 3 and 4 may be formed by wet etching or dry etching.

Step 4: Graphene is formed on the electrodes 3, 4 and the insulating layer 5. The graphene may be formed by epitaxial growth, or a graphene layer formed in advance using a CVD method may be transferred and attached. Alternatively, graphene separated by mechanical separation or the like may be transferred. Subsequently, the graphene is coated with a resist mask by photolithography or the like, and etched and patterned by oxygen plasma. Thereby, unnecessary portions of the graphene other than a channel portion and regions in contact with the electrodes 3 and 4 are removed to form the light reception graphene 1 and the reference graphene 2.

Step 5: A resist mask is coated on the reference graphene 2 by photolithography or the like. At this time, the light reception graphene 1 not coated with the resist mask is doped into an n-type with a tetramethylammonium hydroxide solution used as a developer. Thereafter, the resist mask on the reference graphene 2 may be peeled or may not be peeled. If the resist mask is not peeled off, the reference graphene 2 is doped into a p-type by the resist mask.

The electromagnetic wave detector 100 according to the first embodiment of the present invention is completed by the above steps 1 to 5.

Note that it is possible to control a doping level of the light reception graphene 1 by changing immersion time in the tetramethylammonium hydroxide solution. By controlling the doping level, the gate voltage is controlled so that the light reception graphene 1 generates intraband transition and the reference graphene 2 generates the Pauli blocking at the detection wavelength. Accordingly, the electromagnetic wave detection according to the first embodiment is realized. In addition, by providing a top gate on the reference graphene 2, the light reception graphene 1 is controlled by the back gate, while the reference graphene 2 is controlled by the top gate, so that the both are set to any doping level. It is also possible to increase an absorption difference at any wavelength. By changing the gate voltages of the both, it is possible to selectively set the wavelength at which the absorptivity increases.

Although the graphene is formed on the electrodes 3 and 4 here, the graphene may be formed on the insulating layer 5 in advance, and then the electrodes 3 and 4 may be formed. However, in a case of using this structure, care must be taken so as not to cause process damage to the graphene when the electrodes 3 and 4 are formed.

Further, the detection circuit 7, the balance circuit 8, and the operation circuits 9 are preferably formed on the substrate 6, but may be external circuits.

As described above, in the electromagnetic wave detector 100 according to the first embodiment of the present invention, by detecting a differential response between an electromagnetic wave response when photocarriers are generated by intraband transition of the graphene and an electromagnetic wave response when no photocarrier is generated by intraband transition or interband transition due to the Pauli blocking, a response when not being irradiated with the electromagnetic wave can be made zero, and a detection signal can be reduced in noise, thereby improving an S/N ratio.

Further, since the differential response between the graphene is output as the detection signal, it is possible to cancel time change and temperature change of the response, and to reduce noise of the detection signal.

In addition, since the photocarriers are generated by the intraband transition, the absorptivity of the graphene is significantly increased as compared with a case where interband transition is used, and highly sensitive detection can be performed.

Furthermore, in the wavelength region where the Pauli blocking does not occur, wavelength selectivity can be also obtained because there is no change in the absorptivity of the graphene.

Second Embodiment

Figure 3A:
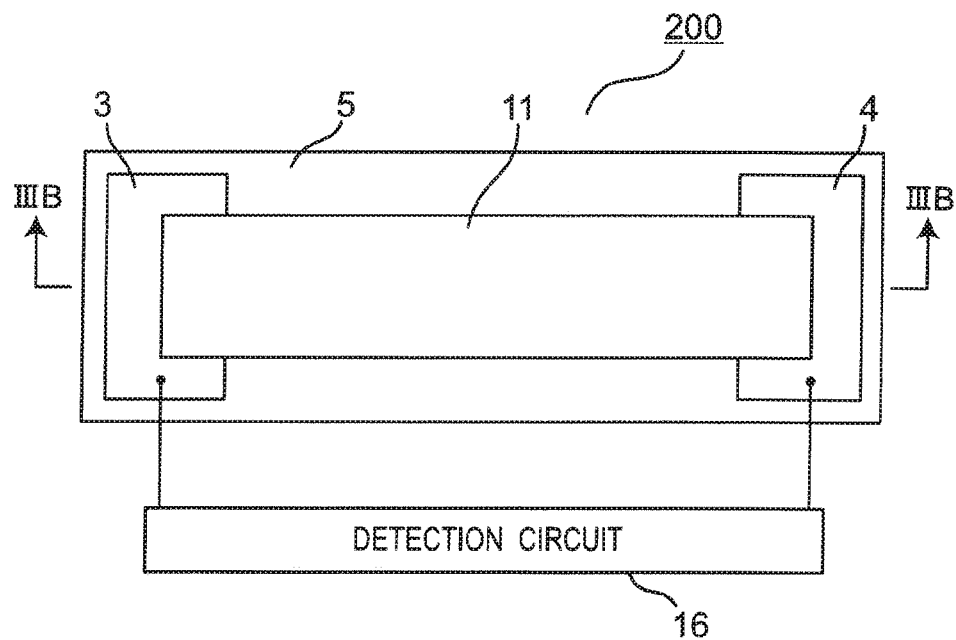
FIG. 3A is a top view of an electromagnetic wave detector according to a second embodiment of the present invention.
Figure 3B:
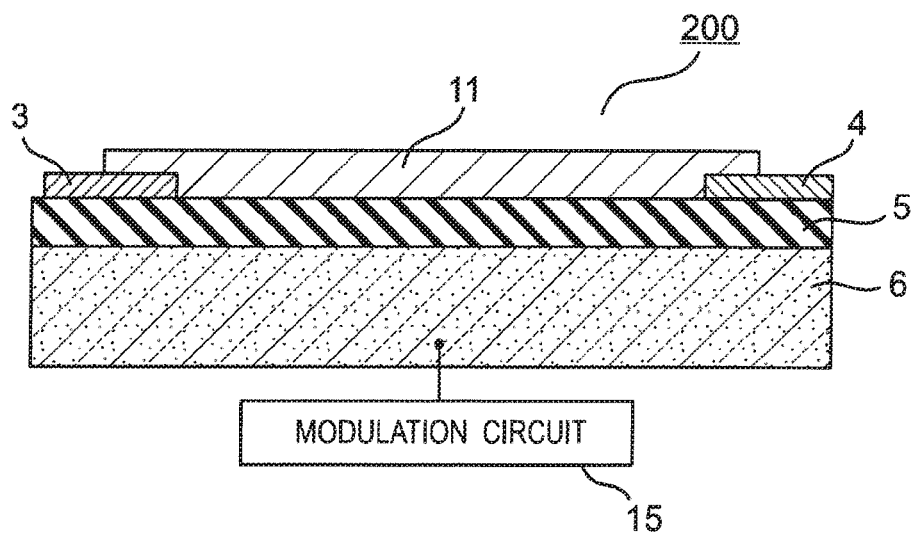
FIG. 3B is a sectional view of the electromagnetic wave detector of FIG. 3A as viewed in a IIIB-IIIB direction.

FIG. 3A is a top view of an electromagnetic wave detector according to a second embodiment of the present invention, which is generally indicated by 200, and FIG. 3B is a sectional view of the electromagnetic wave detector 200 of FIG. 3A as viewed in a IIIB-IIIB direction. In FIGS. 3A and 3B, the same reference symbols in FIGS. 1A and 1B indicate the same or corresponding portions.

In the electromagnetic wave detector 200, an insulating layer 5 is formed on a substrate 6, and a pair of electrodes 3 and 4 is provided on the insulating layer 5. A graphene 11 is provided on the insulating layer 5 so that both ends are connected to the electrodes 3 and 4, respectively. In addition, a modulation circuit 15 for temporally changing a gate voltage is connected to the substrate 6 which also serves as a gate electrode. Further, a detection circuit 16 for detecting a differential photocurrent is connected between the electrodes 3 and 4. The detection circuit 16 may be used as an operation circuit for applying a voltage.

The electromagnetic wave detector 200 according to the second embodiment differs from the electromagnetic wave detector 100 according to the first embodiment in that while the electromagnetic wave detector 100 has two types of graphene 1 and and detects the differential signal thereof, in the electromagnetic wave detector 200, a difference in light response between a light shielding state and a light receiving state is detected by a graphene transistor provided with one type of the graphene 11.

Note that, in the present specification, a state in which graphene where an electromagnetic wave of a detection wavelength is incident does not perform interband transition or intraband transition due to a Pauli blocking effect is referred to as "light shielding state". On the other hand, a state in which the graphene where an electromagnetic wave of a detection wavelength is incident performs carrier excitation by intraband transition is referred to as a "light receiving state".

Figure 4:
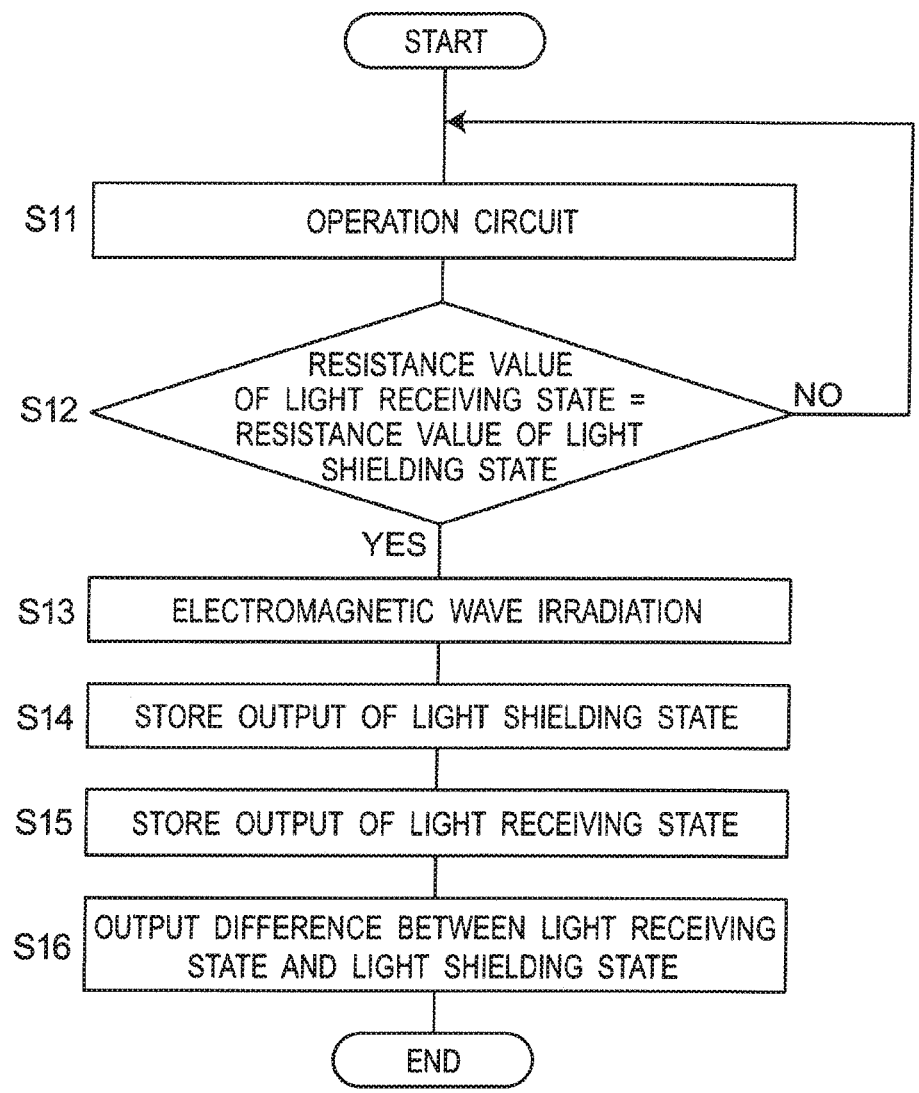
FIG. 4 is a flowchart of operation of the electromagnetic wave detector according to the second embodiment of the present invention.

FIG. 4A is an operation flowchart of the electromagnetic wave detector 200 according to the second embodiment of the present invention, and FIG. 4B is a diagram showing an operation principle of the electromagnetic wave detector 200.

In an operation method of the electromagnetic wave detector 200, first, in a dark state, a source/drain voltage Vd is applied between the electrodes 3 and 4 from the detection circuit 16 which also serves as the operation circuit. Then, a gate voltage Vbg is applied to the substrate 6 (S11) from the modulation circuit 15. Vbg in which graphene is in a light receiving state and a light shielding state is set to an electromagnetic wave of a detection wavelength, and then Vd is set so that source/drain currents Id in the light receiving state and the light shielding state have the same value. Vbg and Vd at this time are stored (S12).

Next, the electromagnetic wave of the detection wavelength is irradiated (S13), and the gate voltage Vbg and the source/drain voltage Vd stored in step S12 are applied to detect the source/drain currents Id in the light shielding state and the light receiving state (S14, S15).

Finally, a difference in the source/drain currents Id between the light shielding state and the light receiving state is output (S16).

As described above, in the electromagnetic wave detector 200 according to the second embodiment of the present invention, by detecting a differential response between an electric signal in the light receiving state in which photocarriers are generated by the intraband transition of the graphene and an electric signal in the light shielding state in which no photocarrier is generated by the intraband transition and the interband transition due to the Pauli blocking, a response when not being irradiated with the electromagnetic wave can be made zero, and a detection signal can be reduced in noise, thereby improving an S/N ratio.

In the second embodiment, the gate voltage is applied to the substrate 6 from a back gate, but may be applied from the top of the graphene 11 by forming a top gate. Further, in the second embodiment, although the method of detecting the electromagnetic wave response as the current is described, it may be detected as a voltage.

Figure 5:
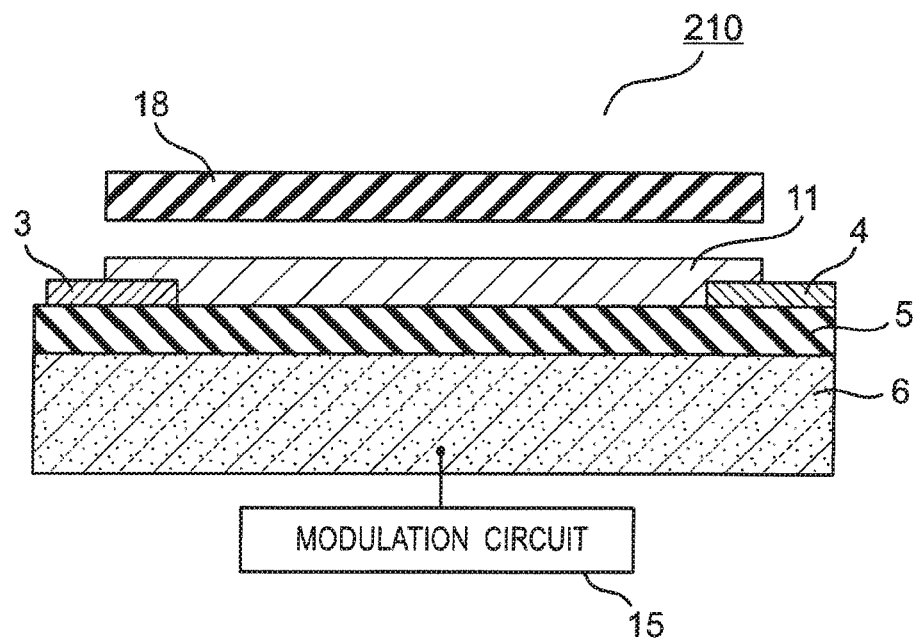
FIG. 5 is a sectional view of another electromagnetic wave detector according to the second embodiment of the present invention.
Figure 6:
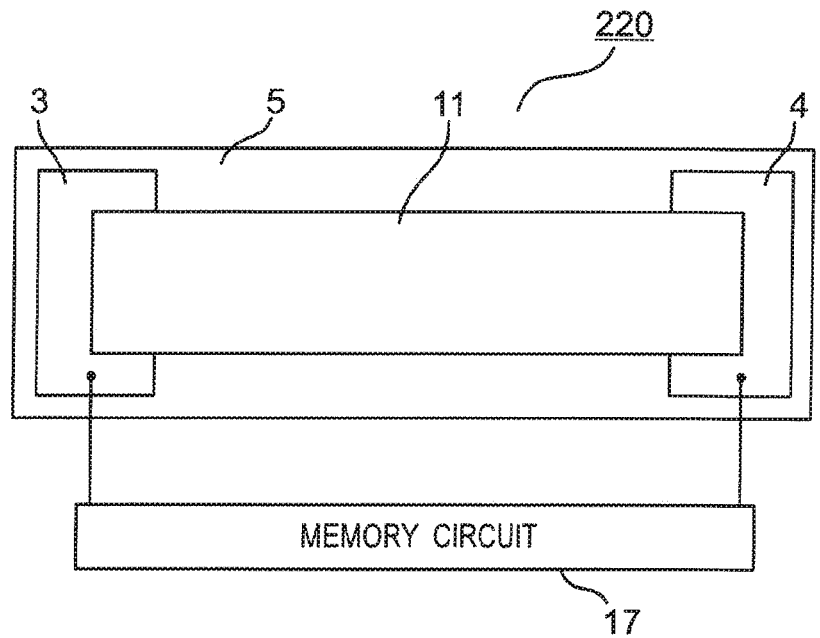
FIG. 6 is a top view of another electromagnetic wave detector according to the second embodiment of the present invention.

FIGS. 5 and 6 show a sectional view and a top view of other electromagnetic wave detectors 210, 220 according to the second embodiment of the present invention. For switching between a dark state and a bright state, a shutter mechanism 18 as shown in FIG. 5 may be used. The shutter mechanism 18 enables arbitrary switching of light and dark. When the shutter mechanism 18 is introduced, operation can be simplified because it is not necessary to control a doping level of graphene.

Further, as shown in FIG. 6, a memory circuit 17 may be provided between terminals of electrodes 3 and 4 to store an output in each state.

As described above, in the electromagnetic wave detector 200 according to the second embodiment of the present invention, the outputs of the light receiving state and the light shielding state are measured using a single graphene to obtain the difference. Accordingly, the response when not being irradiated with the electromagnetic wave can be made zero, and the electromagnetic wave can be detected with high sensitivity.

Third Embodiment

Figure 7A:
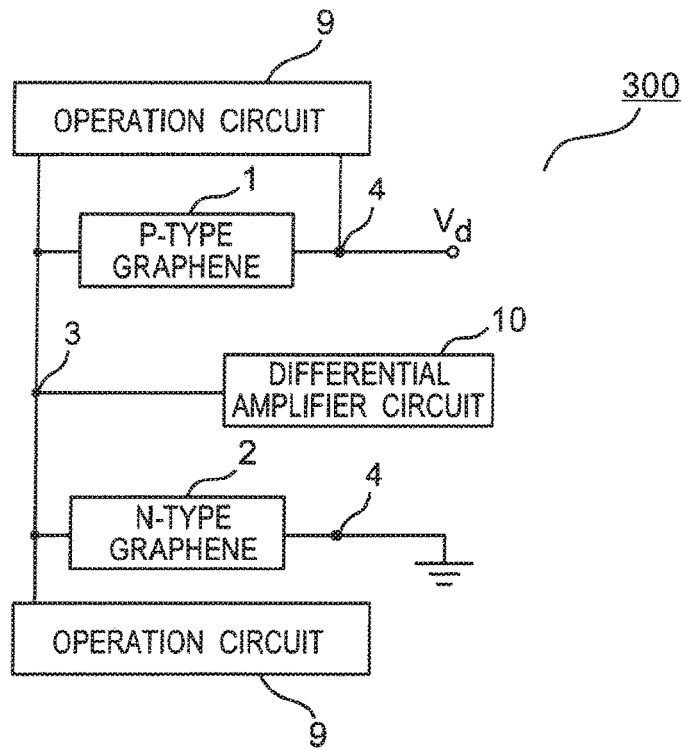
FIG. 7A is a circuit diagram of an electromagnetic wave detector according to a third embodiment of the present invention.
Figure 7B:
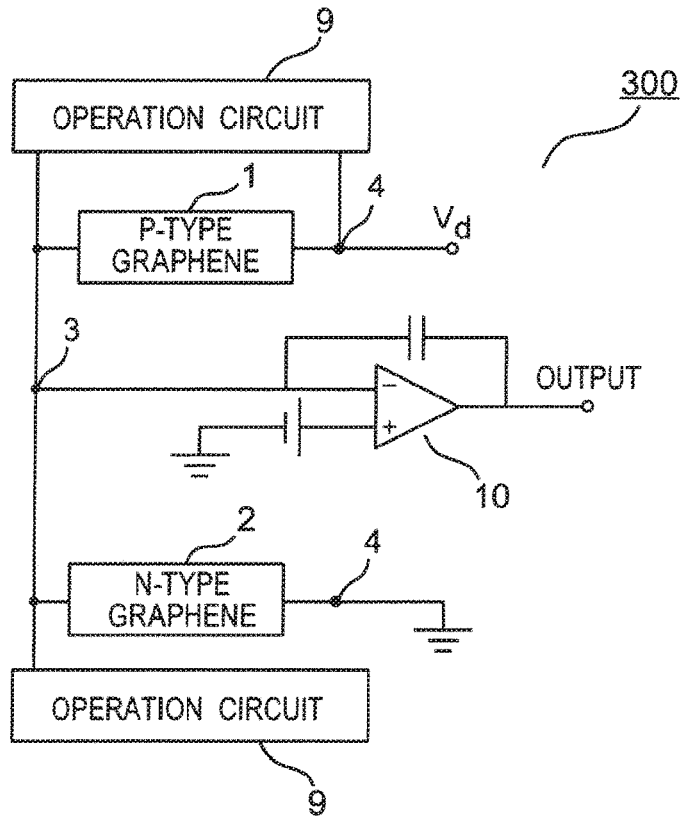
FIG. 7B is a differential amplifier circuit diagram of the electromagnetic wave detector according to the third embodiment of the present invention.

FIG. 7A is a circuit diagram of an electromagnetic wave detector according to a third embodiment of the present invention, generally represented by 300, and FIG. 7B is a circuit diagram of the electromagnetic wave detector 300 according to the third embodiment of the present invention. In FIGS. 7A and 7B, the same reference symbols as in FIGS. 1C and 1D indicate the same or corresponding portions.

The electromagnetic wave detector 300 according to the third embodiment is different from the electromagnetic wave detector 100 according to the first embodiment in that, as shown in FIG. 7A, a differential amplifier circuit 10 is connected to an electrode 3 as a detection circuit. In the electromagnetic wave detector 100, it is necessary to balance the circuit using the balance circuit 8. However, in the electromagnetic wave detector 300, since a differential current flowing in a light reception graphene 1 and a reference graphene 2 in a bright state is used as an input to the differential amplifier circuit 10, the need for a balance circuit is eliminated, a single pixel is simplified, and miniaturization is enabled. Further, a configuration of the differential amplifier circuit 10 is not limited as long as it can detect the differential current flowing in the light reception graphene 1 and the reference graphene 2. For example, as shown in FIG. 7B, an integrating circuit using an operational amplifier may be used as the differential amplifier circuit 10. By using the operational amplifier, an average value of outputs can be obtained, and an S/N ratio is improved.

Fourth Embodiment

Figure 8A:
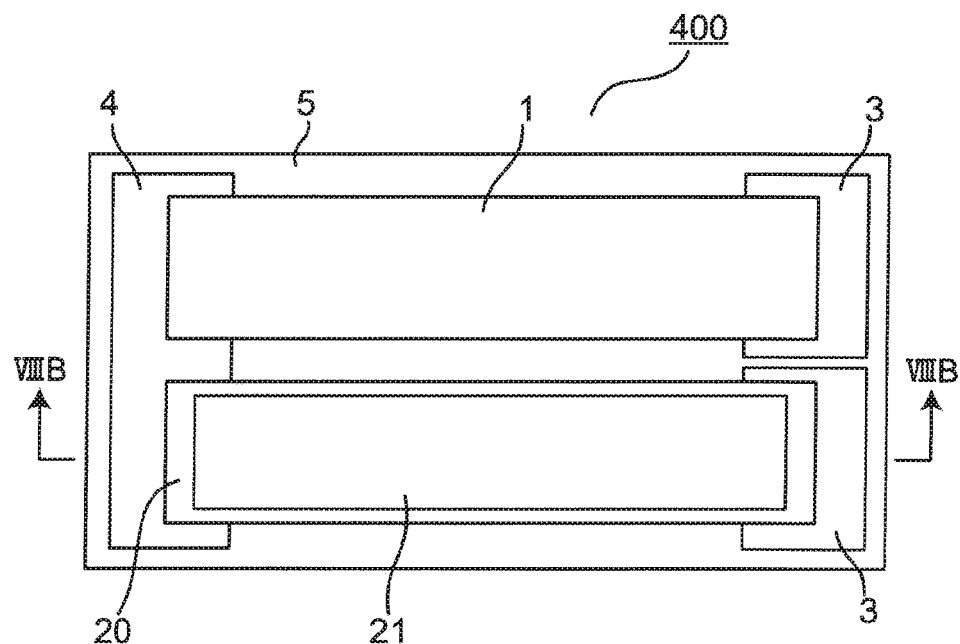
FIG. 8A is a top view of an electromagnetic wave detector according to a fourth embodiment of the present invention.
Figure 8B:
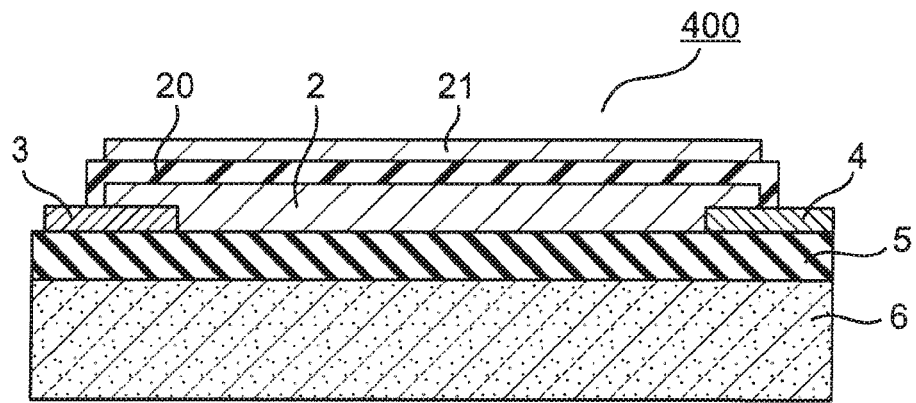
FIG. 8B is a sectional view of the electromagnetic wave detector in FIG. 8A as viewed in an VIIIB-VIIIB direction.
Figure 8C:
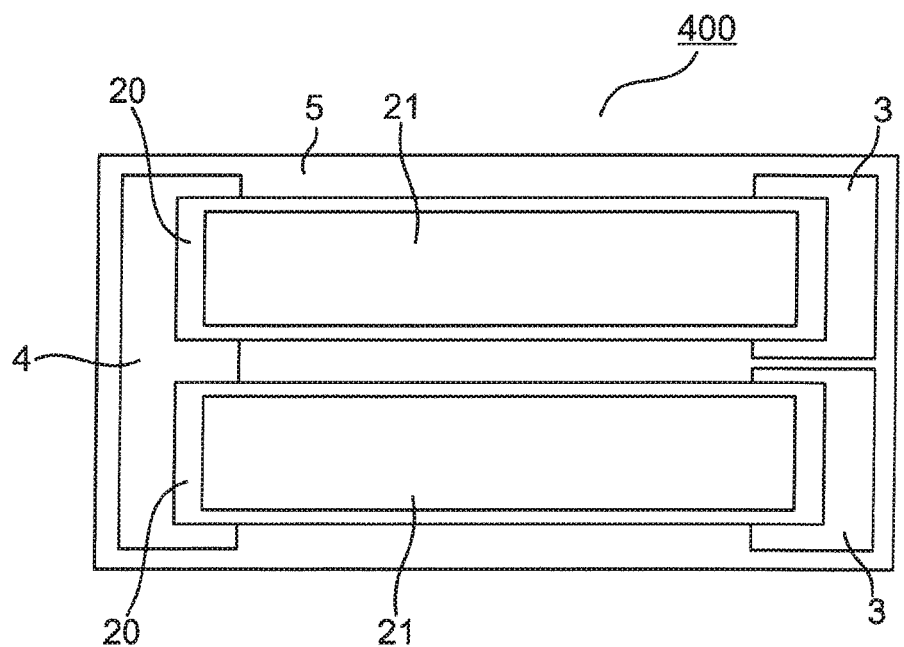
FIG. 8C is a top view of another electromagnetic wave detector according to the fourth embodiment of the present invention.

FIG. 8A is a top view of an electromagnetic wave detector according to a fourth embodiment of the present invention, generally indicated by 400, and FIG. 8B is a sectional view of the electromagnetic wave detector 400 of FIG. 8A as viewed in an VIIIB-VIIIB direction. Further, FIG. 8C is a top view of another electromagnetic wave detector according to the fourth embodiment of the present invention, which is generally denoted by 450. In FIGS. 8A, 8B, and 8C, the same reference symbols as in FIGS. 1A and 1B indicate the same or corresponding portions.

A difference between the electromagnetic wave detector 400 according to the fourth embodiment of the present invention and the electromagnetic wave detector 100 according to the first embodiment is that, as shown in FIGS. 8A and 8B, a top gate electrode 21 is formed on a reference graphene 2 via an insulating layer 20. The insulating layer 20 and the top gate electrode 21 may alternatively be formed on a light reception graphene 1 or on both the light reception graphene 1 and the reference graphene 2 as shown in FIG. 8C.

By providing such a top gate electrode 21, graphene can be doped from both a back gate and a top gate. Therefore, for example, even when Dirac point voltages of the light reception graphene 1 and the reference graphene 2 are the same, by controlling either one of them by the back gate and controlling the other by the back gate and the top gate, it is possible to obtain any Dirac point voltage. As a result, the graphene can be selectively doped without chemical doping of the light reception graphene 1 and the reference graphene 2, and a drive range of the electromagnetic wave detector is expanded. Further, in a case of the chemical doping, although a temporal change may occur depending on a form of the electromagnetic wave detector, the electromagnetic wave detector 400 can eliminate a change in a doping level due to the temporal change.

In addition, by forming the insulating layer 20 so as to cover the light reception graphene 1 and the reference graphene 2, a function of a protective film can also be obtained. By providing the protective film, it is possible to prevent a property of the graphene from being changed due to influence of a surrounding atmosphere. In particular, in the atmosphere, the graphene is affected by air molecules and moisture to change a Dirac point, so providing the protective film ensures stable operation of the graphene. Also, in a case where the electromagnetic wave detector is used in a high temperature or low temperature environment, it is equally important to stably hold the operation of graphene. For example, silicon oxide ($SiO_2$), aluminum oxide ($Al_2O_3$), silicon nitride (SiN), hafnium oxide ($HfO_2$), boron nitride, or the like can be used as the insulating layer 20 also serving as the protective film. As a material for the insulating layer 20 also serving as the protective film, it is preferable to select a material through which an electromagnetic wave to be detected is transmitted.

Fifth Embodiment

Figure 9A:
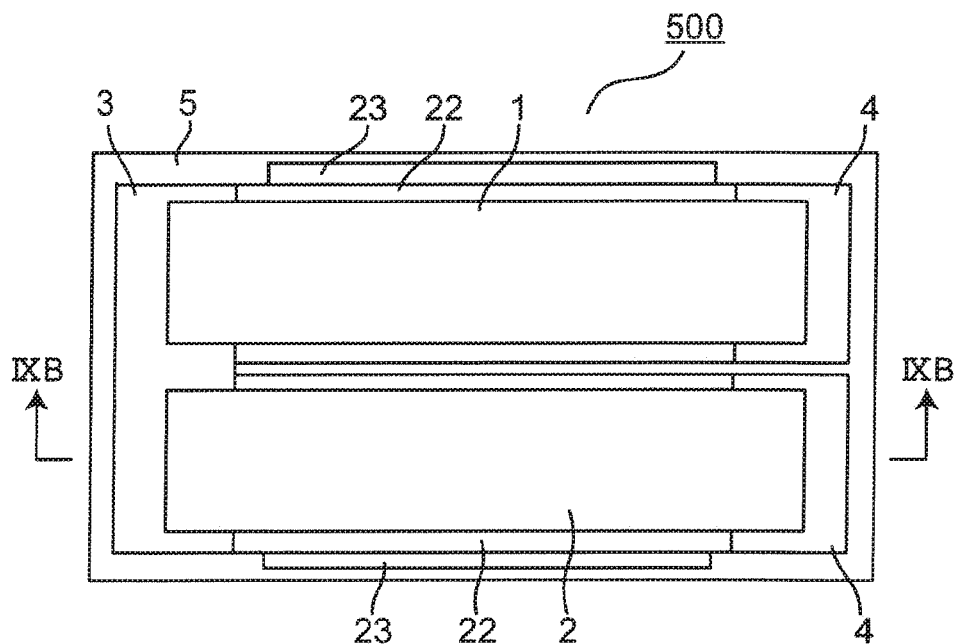
FIG. 9A is a top view of an electromagnetic wave detector according to a fifth embodiment of the present invention.
Figure 9B:
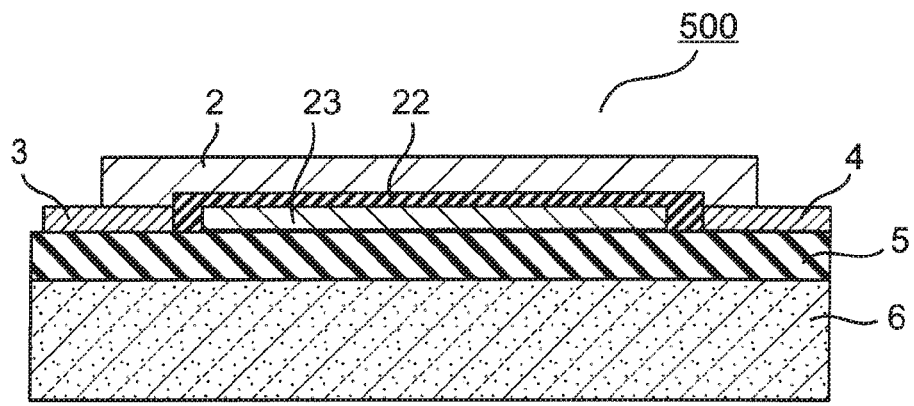
FIG. 9B is a sectional view of the electromagnetic wave detector in FIG. 9A as viewed in a IXB-IXB direction.

FIG. 9A is a top view of an electromagnetic wave detector according to a fifth embodiment of the present invention, which is generally represented by 500, and FIG. 9B is a sectional view of the electromagnetic wave detector 500 of FIG. 9A as viewed in a IXB-IXB direction. In FIGS. 9A and 9B, the same reference symbols as in FIGS. 1A and 1B indicate the same or corresponding portions.

The electromagnetic wave detector 500 according to the fifth embodiment of the present invention differs from the electromagnetic wave detector 100 according to the first embodiment in that, as shown in FIGS. 9A and 9B, in the electromagnetic wave detector 500, an insulating layer 22 and a back gate electrode 23 are formed between an insulating layer 5 and a light reception graphene 1 or a reference graphene 2. Thus, graphene can be doped from two back gates of a back gate to which a voltage is applied from a substrate 6 and the back gate electrode 23. Therefore, for example, even when Dirac point voltages of the light reception graphene 1 and the reference graphene 2 are the same, by controlling either one of them by the back gate applied from the substrate 6 and controlling the other by the back gate applied from the back gate electrode 23 on a surface side, it is possible to obtain any Dirac point voltage. Thus, the graphene can be selectively doped without chemical doping, so a drive range of the electromagnetic wave detector is expanded. Further, in a case of the chemical doping, although a temporal change may occur depending on a form of the electromagnetic wave detector, the electromagnetic wave detector 500 can eliminate a change in a doping level due to the temporal change.

In particular, in the electromagnetic wave detector 500 according to the fifth embodiment, since the back gate electrode is disposed under the light reception graphene 1 and the reference graphene 2, the doping level of the graphene can be controlled without attenuating the electromagnetic wave incident on the light reception graphene 1 and the reference graphene 2.

Note that, although, in FIG. 9A, a case where the insulating layer 22 and the back gate electrode 23 are formed between the insulating layer 5 and both of the light reception graphene 1 and the reference graphene 2 has been described, the insulating layer 22 and the back gate electrode 23 may be provided between the insulating layer 5 and one of the light reception graphene 1 and the reference graphene 2.

Sixth Embodiment

Figure 10A:
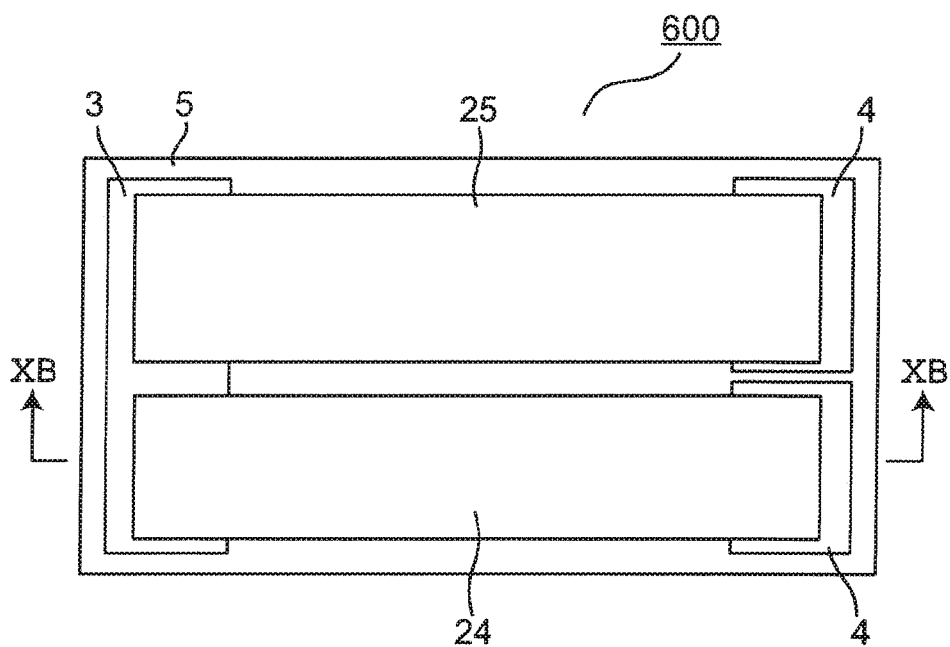
FIG. 10A is a top view of an electromagnetic wave detector according to a sixth embodiment of the present invention.
Figure 10B:
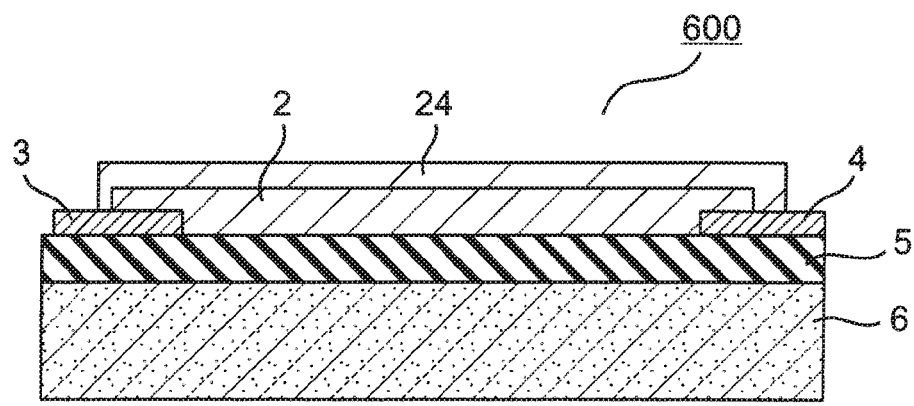
FIG. 10B is a sectional view of the electromagnetic wave detector in FIG. 10A as viewed in a XB-XB direction.
Figure 10C:
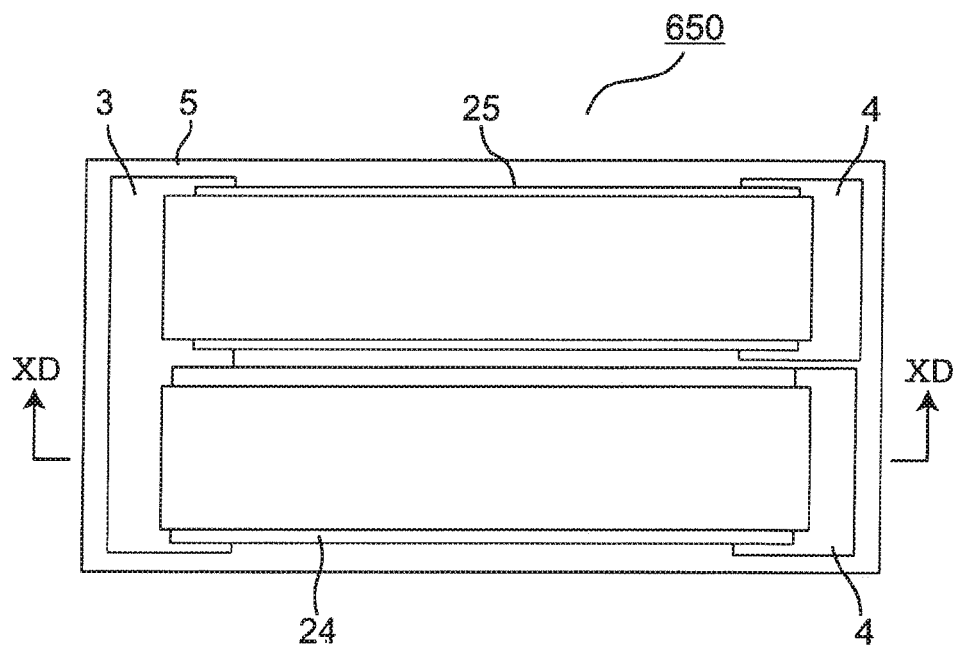
FIG. 10C is a top view of another electromagnetic wave detector according to the sixth embodiment of the present invention.
Figure 10D:
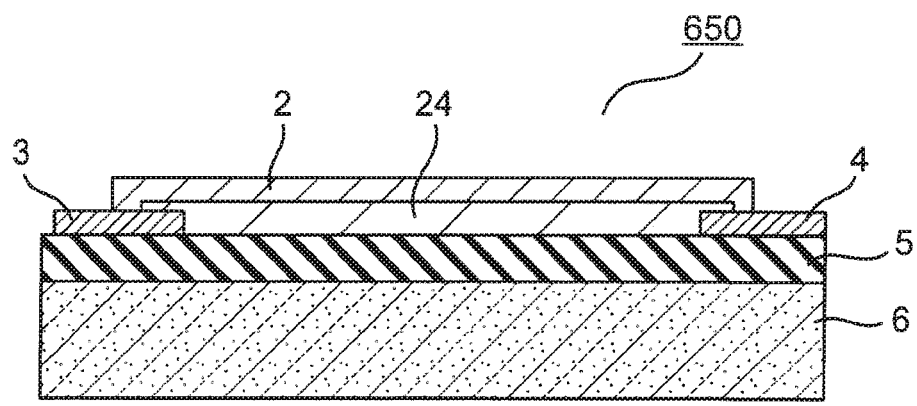
FIG. 10D is a sectional view of the electromagnetic wave detector in FIG. 10C as viewed in a XD-XD direction.

FIG. 10A is a top view of an electromagnetic wave detector according to a sixth embodiment of the present invention, generally represented by 600, and FIG. 10B is a sectional view of the electromagnetic wave detector 600 of FIG. 10A as viewed in a XB-XB direction. Further, FIG. 10C is a top view of another electromagnetic wave detector according to the sixth embodiment of the present invention, which is generally represented by 650, and FIG. 10D is a sectional view of the electromagnetic wave detector 650 of FIG. 10C as viewed in a XD-XD direction. In FIGS. 10A to 10D, the same reference symbols as in FIGS. 1A and 1B indicate the same or corresponding portions.

The electromagnetic wave detector 600 according to the sixth embodiment of the present invention differs from the electromagnetic wave detector 100 of the first embodiment in that, as shown in FIGS. 10A and 10B, contact layers 24 and 25 are provided on both of a light reception graphene 1 and a reference graphene 2 in the electromagnetic wave detector 600. The contact layers 24 and 25 can supply holes or electrons by contacting with the graphene. Therefore, it is possible to arbitrarily dope the graphene by the contact layers 24 and 25. In the electromagnetic wave detector 600 of FIGS. 10A and 10B, the contact layers 24 and 25 are provided on both of the light reception graphene 1 and the reference graphene 2, but like the electromagnetic wave detector 650 of FIGS. 10C and 10D, they may be provided between the graphene and the insulating layer 5 not on the graphene but under the graphene. Alternatively, they may be provided only on or under one of the light reception graphene 1 and the reference graphene 2.

The contact layers 24 and 25 are made of, for example, a material having a polar group, and an electron withdrawing group has an effect of reducing electron density, and an electron donating group has an effect of increasing the electron density. The electron withdrawing group includes, for example, halogen, nitrile, a carboxyl group, a carbonyl group, and the like. In addition, the electron donating group includes, for example, an alkyl group, alcohol, an amino group, a hydroxyl group, and the like. In addition to these materials, materials in which charge bias occurs in a whole molecule due to polar groups can also be applied as the material for the contact layers 24 and 25. In addition, in organic substances, metals, semiconductors, insulators, two-dimensional materials, or a mixture of any of these, materials in which polarization occurs due to charge bias in the molecule can also be applied as the material for the contact layers 24 and 25.

In general, when graphene is brought into contact with an inorganic contact layer, it is known that doping of the graphene is p-type if a work function of the contact layer is larger than a work function of the graphene and is n-type if it is smaller. However, when the contact layer is organic, it does not have a clear work function, and whether it becomes n-type dope or p-type dope to the graphene depends on polarity of a molecule used for the contact layer. For this reason, it is necessary to judge from the polar group of the material for the contact layer.

Here, film thickness of the contact layers 24 and 25 is preferably as thin as possible so that doping can be performed on graphene in such a manner that photoelectric conversion can be performed when the graphene is irradiated with an electromagnetic wave. In addition, although the contact layers 24 and 25 are described in expression of layers, they do not have to be strictly layers as long as carriers such as molecules and electrons are introduced into the graphene. For example, by immersing graphene in a solution and supplying carriers to the graphene on a molecular level, doping can be performed without forming a substantially layered contact layer. Thereby, the graphene can be doped with the electromagnetic wave to be detected without being absorbed by the contact layer.

By forming the contact layers 24 and 25 under the light reception graphene 1 or the reference graphene 2, the input electromagnetic wave reaches the graphene without being blocked by the contact layers 24 and 25, so that a material which does not transmit a magnetic wave can be also used as the material for the contact layers 24, 25. For example, in a case where visible light is used as input light, even if a material which does not transmit visible light is used for the contact layers 24 and 25, the input light can reach the graphene without being attenuated.

Further, by forming (transferring) the graphene after the formation of the contact layers 24 and 25, process damage to the graphene can be suppressed. Reduction of the process damage is very effective because the graphene is easily damaged by wet process and mobility thereof is easily reduced.

For example, in a case where a composition containing a photosensitive agent having a quinonediazido group and a novolak resin, which is generally referred to as a positive photoresist, is formed as the contact layer 24 on the light reception graphene 1, the reference graphene 2 in which a resist mask is not formed is doped into an n-type by a tetramethylammonium hydroxide solution used as a developer in a photolithography process. For this reason, the light reception graphene 1 and the reference graphene 2 can be obtained only by development processing of the resist mask. At this time, the contact layer 25 is formed of tetramethylammonium hydroxide. As a result, mask formation processing is not required, process damage can be reduced, and the process can be simplified.

When the contact layers 24 and 25 are formed of a material that causes polarity conversion, the polarity conversion of the contact layers 24 and 25 supplies electrons or holes generated during the conversion to the graphene. Thereby, doping occurs in the light reception graphene 1 and the reference graphene 2 in contact with the contact layers 24 and 25. In this case, even if the contact layers 24 and 25 are removed, the graphene in contact with the contact layers 24 and 25 remains in the doped state, so the electromagnetic wave detector 600 can be formed in a state where the contact layers 24 and 25 are removed. Thereby, an opening area of the graphene is increased, and detection sensitivity is improved. Here, the polarity conversion is a phenomenon in which a polar group is chemically converted. For example, an electron withdrawing group is changed to an electron donating group, an electron donating group is changed to an electron withdrawing group, a polar group is changed to a nonpolar group, or a nonpolar group is changed to a polar group.

When the contact layers 24 and 25 are formed of a material that causes polarity conversion by electromagnetic wave irradiation, by selecting a material that causes polarity conversion at a detection electromagnetic wavelength, polarity conversion occurs only during photoirradiation, and a photocurrent can be increased. As a result, detection sensitivity of an electromagnetic wave is improved. In addition, the graphene can be doped similarly, in a case where oxidation/reduction reaction occurs by the electromagnetic wave irradiation and electrons or holes are generated during the reaction.

In a case where the contact layers 24 and 25 are formed of a material such as quantum dots, ferroelectrics, liquid crystals, fullerenes, or the like in which an electric field change occurs due to electromagnetic wave irradiation, an electric field generated in the graphene is changed by generating an electric field change at a detection electromagnetic wavelength. As a result, a photogate effect occurs, and a gate voltage is applied in a pseudo manner, and a photocurrent is increased to increase detection sensitivity.

By using a one-dimensional periodic structure as the contact layers 24 and 25, polarization dependence occurs when the contact layers are made of a material that generates surface plasmon resonance by electromagnetic wave irradiation. For this reason, it is possible to form an electromagnetic wave detector that detects only specific polarized light.

By using a two-dimensional periodic structure as the contact layers 24 and 25, when the contact layers are made of a material that generates surface plasmon resonance by electromagnetic wave irradiation, only an electromagnetic wave having a specific resonance wavelength can be detected strongly, and detection sensitivity of a specific wavelength can be increased.

Seventh Embodiment

In an electromagnetic wave detector (not shown) according to a seventh embodiment of the present invention, in the electromagnetic wave detector 100, a two-dimensional material such as two or more layers of graphene, transition metal dichalcogenide, or black phosphorus is used as a light reception graphene 1 and a reference graphene 2. The other structure is the same as that of the electromagnetic wave detector 100.

The two-dimensional material such as transition metal dichalcogenide or black phosphorus is called a two-dimensional material because it has the same atomic layered structure as graphene, and is made of transition metal dichalcogenide of, for example, $MoS_2$, $WS_2$, $WSe_2$, black phosphorus, or the like. Further, among these materials, materials of the same kind or different materials may be laminated. Alternatively, different materials of perovskite and graphene or a two-dimensional material may be joined.

These two-dimensional materials such as transition metal dichalcogenide or black phosphorus has a predetermined band gap. For this reason, since an off current is almost zero, noise of the electromagnetic wave detector is reduced, and performance of the electromagnetic wave detector can be improved.

Further, in a case where the two-dimensional materials such as two or more layers of graphene, transition metal dichalcogenide or black phosphorus are laminated, size of a band gap can be adjusted by the number of layers. Therefore, a wavelength of an electromagnetic wave to be detected can be selected based on the number of layers to be laminated. Thus, it is possible to obtain a wavelength selective electromagnetic wave detector that detects only an electromagnetic wave of a specific wavelength. In particular, as in a case of an electromagnetic wave detector using a conventional semiconductor material, there is no need to control the band gap by a composition of a semiconductor material, which facilitates a manufacturing process. Moreover, since it is not necessary to use an optical filter which is typical wavelength selection means, the number of optical components can be reduced, and loss of incident light by passing through the filter can also be reduced.

In addition, in a case where the two-dimensional material such as transition metal dichalcogenide or black phosphorus is used, polarization dependence can be obtained by using a layered structure including a plurality of layers. Therefore, it is possible to realize an electromagnetic wave detector that selectively detects only specific polarized light.

Furthermore, a heterojunction is obtained by combining two or more different materials of these two-dimensional materials such as transition metal dichalcogenide and black phosphorus, or combining the two-dimensional material such as transition metal dichalcogenide or black phosphorus and graphene. By doing this, the same effect as a quantum well structure and a tunneling current in the conventional semiconductor material can be realized between the different materials. As a result, noise can be reduced and recombination can be reduced, so that detection sensitivity of the electromagnetic wave detector can be increased.

In addition, when graphene nanoribbons are used, electron density of graphene can be modulated. In this case, electrons in the graphene are coupled to an incident electromagnetic wave, and surface plasmon is excited. In a case of the graphene, a wavelength of the surface plasmon is 10 μm, which is an infrared wavelength band. Therefore, surface plasmon resonance can be used by processing the graphene into a nanoribbon shape. As a result, not only photoelectric conversion of normal graphene, but also an enhancement effect of detection sensitivity by an effect of the surface plasmon appears.

Furthermore, since the graphene nanoribbons have asymmetry in a plane with respect to the incident electromagnetic wave, they have polarization dependence in photoresponse. In a case of the graphene nanoribbons, an electromagnetic wave having 90° polarized light (an electric field of the electromagnetic wave is parallel to a Y axis) is selectively absorbed and does not respond to 0° polarized light. In other words, selective detection of polarized light is possible.

Eighth Embodiment

Figure 11A:
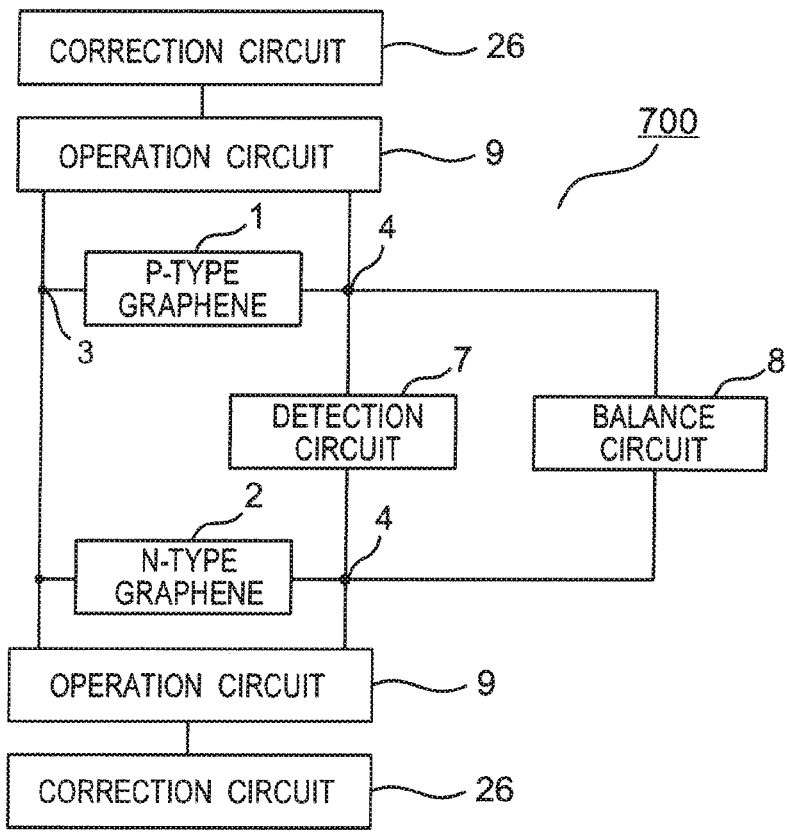
FIG. 11A is a circuit diagram of an electromagnetic wave detector according to an eighth embodiment of the present invention.

FIG. 11A is a circuit diagram of an electromagnetic wave detector according to an eighth embodiment of the present invention, generally denoted by 700. In FIG. 11A, the same reference symbols as in FIGS. 1C and 1D indicate the same or corresponding portions.

The electromagnetic wave detector 700 according to the eighth embodiment is different from the electromagnetic wave detector 100 according to the first embodiment in that, as shown in FIG. 11A, the electromagnetic wave detector 700 has correction circuits 26 each of which detects a value of a current or a voltage generated in a light reception graphene 1, a reference graphene 2 and correct it so that the light reception graphene 1 and the reference graphene 2 always have the same resistance value. In response to a change with time of the currents or voltages of the light reception graphene 1 and the reference graphene 2 operated by operation circuits 9, the correction circuits 26 detect the values of the currents or voltages generated in the light reception graphene 1 and the reference graphene 2 and correct them as needed. A difference in the values of the currents or voltages flowing through the graphene causes an error when a time variation occurs, so that the variation can be prevented by using the correction circuits 26.

Figure 11B:
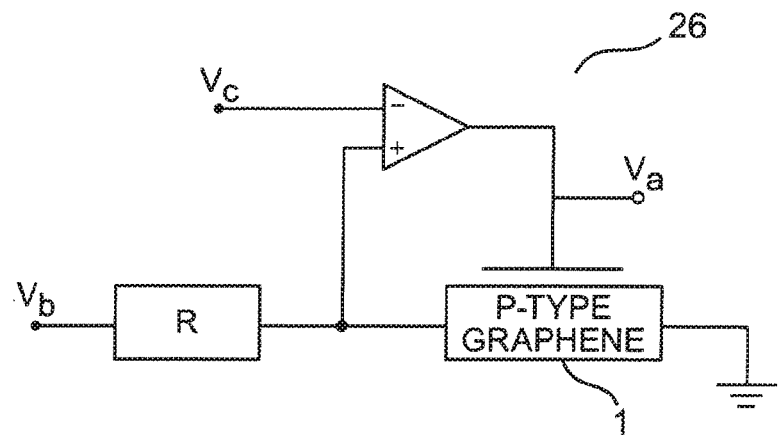
FIG. 11B is a correction circuit diagram of the electromagnetic wave detector according to the eighth embodiment of the present invention.

The correction circuit 26 may use a circuit as shown in FIG. 11B, for example. In the correction circuit 26 of FIG. 11B, by utilizing feedback operation of an operational amplifier, a source/drain current Id flowing through the light reception graphene 1 can be determined by adjusting a resistance element R, and given by Id=(Vb−Vc)/R. At this time, as shown in FIG. 11A, the same correction circuit 26 is applied to the reference graphene 2, and Va is shared by the light reception graphene 1 and the reference graphene 2. By generating the gate voltage Va so that Id becomes constant, it is possible to change Va according to the change with time of the current value. As described above, by utilizing a mechanism for feeding back and correcting an output that is desired to be constant using the operational amplifier or the like, it is possible to prevent the change with time of the currents of the light reception graphene 1 and the reference graphene 2. If it is desired to make the voltage constant, the voltage may be fed back similarly to control the current value. Note that the correction circuit 26 is not limited to the circuit shown in FIG. 11B, and any circuit may be used as long as it is a circuit that detects a current or a voltage and corrects it as needed.

Ninth Embodiment

Figure 12A:
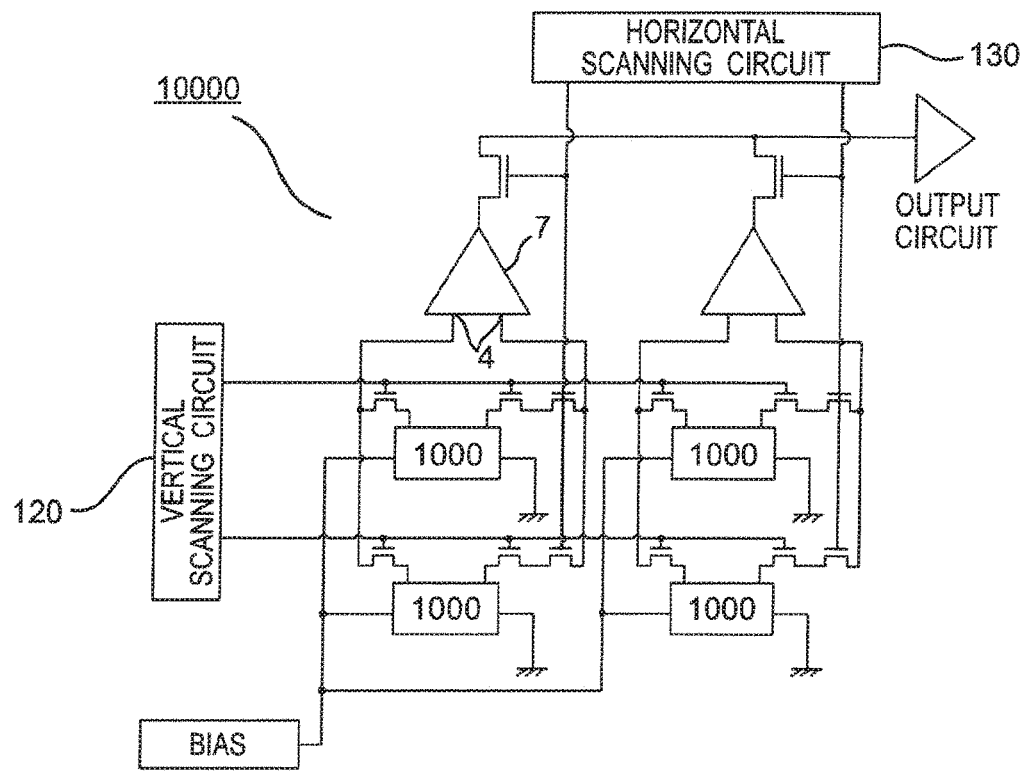
FIG. 12A is a circuit diagram of an electromagnetic wave detector array according to a ninth embodiment of the present invention.

FIG. 12A shows an electromagnetic wave detector array according to a ninth embodiment of the present invention, which is generally represented as 10000. The electromagnetic wave detector array 10000 has pixels 1000 arranged in 2×2, but the number of pixels to be arranged is not limited to this.

Figure 12B:
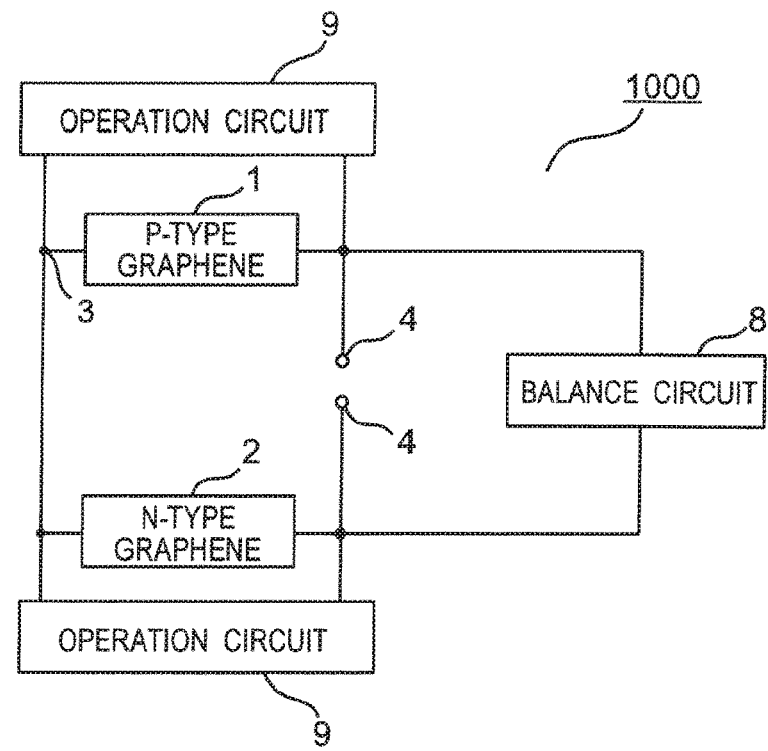
FIG. 12B is a circuit diagram of an electromagnetic wave detector according to the ninth embodiment of the present invention.
Figure 12C:
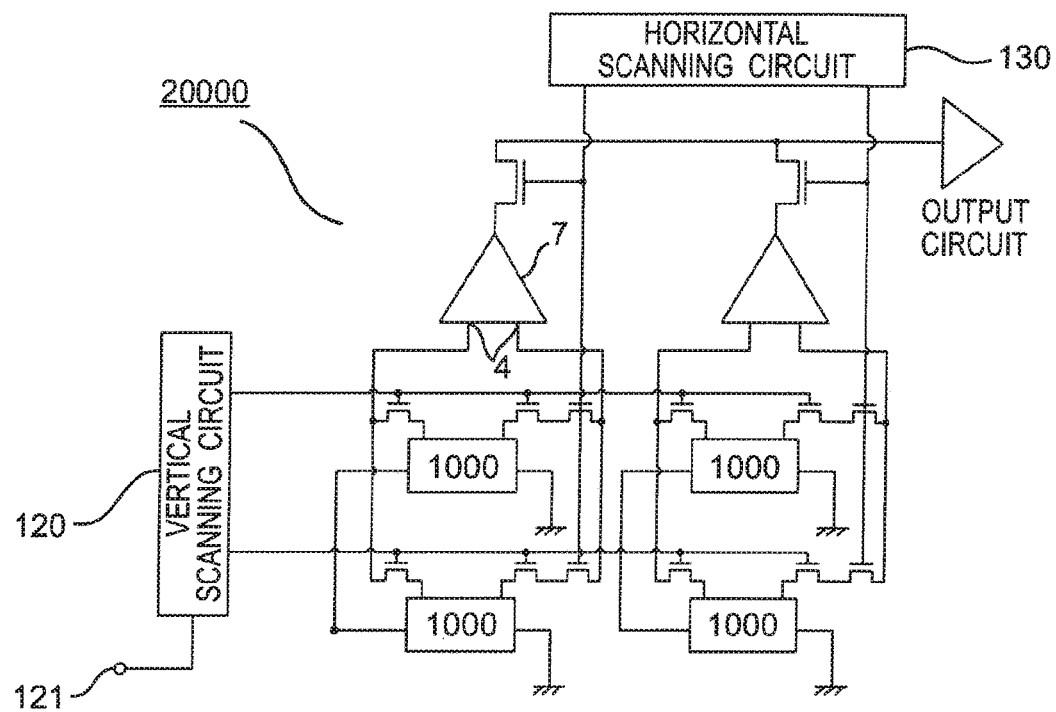
FIG. 12C is a circuit diagram of another electromagnetic wave detector array according to the ninth embodiment of the present invention.

As shown in FIG. 12A, the electromagnetic wave detector array 10000 may detect a signal from each pixel 1000 using a vertical scanning circuit 120 and a horizontal scanning circuit 130. At this time, as shown in FIG. 12B, with a space between terminals of electrodes 4 as an output, a detection circuit 7 is formed of an operational amplifier and disposed for each column. As a result, it becomes unnecessary to provide the detection circuit 7 in the pixel 1000, and size of each pixel 1000 can be reduced. In addition, by disposing other circuits such as a balance circuit and an operation circuit outside the pixel 1000, the size of each pixel 1000 can be further reduced, and a sensor can be miniaturized. Further, as in an electromagnetic wave detector array 20000 shown in FIG. 12C, a circuit 121 for applying a bias voltage Vd may be incorporated in a vertical scanning circuit 120.

Operation of the electromagnetic wave detector array 10000 first makes a dark state difference zero by balancing each single pixel.

Next, a voltage is applied to the vertical scanning circuit 120 to select one row.

Further, a voltage is applied to the horizontal scanning circuit 130 to select one column. Thus, a signal of one pixel 1000 is read out.

By fixing the voltage of the vertical scanning circuit 120 and sequentially applying the voltage to the horizontal scanning circuit 130, all the signals from the pixels 1000 in one row are read out.

Next, the vertical scanning circuit 120 is switched to select another row.

In this state, the horizontal scanning circuit 130 is similarly operated to sequentially read out the signal for each pixel. By repeating this, responses of all the pixels can be read out.

In the ninth embodiment of the present invention, the method of reading out a signal for each pixel using the vertical scanning circuit 120 and the horizontal scanning circuit 130 has been described. However, a column may be first selected by the horizontal scanning circuit 130, and a signal of each pixel may be read out for each column using the vertical scanning circuit 120. In addition, other methods may be used to read out the signal of each pixel.

Further, a timing for balancing the pixel 1000 may be before scanning or may be included in operation during the scanning. Balancing the pixel 1000 before the scanning shortens a scanning time and improves a response speed. On the other hand, balancing during the scanning eliminates a possibility of imbalance over time.

The electromagnetic wave detector array 10000 using graphene can detect electromagnetic waves in a very wide wavelength band from ultraviolet light to microwaves. Therefore, for example, when the electromagnetic wave detector array 10000 is applied to an on-vehicle sensor, it can be used as a camera for visible light image in the daytime, and can also be used as an infrared camera at night, so that it is not necessary to use different cameras depending on a detection wavelength. Moreover, by adjusting detection wavelengths of a light reception graphene 1 and a reference graphene 2 by a gate voltage, chemical doping, and the like and combining and using pixels having different detection wavelengths, an electromagnetic wave detector array having wavelength selectivity can be realized.

Tenth Embodiment

Figure 13A:
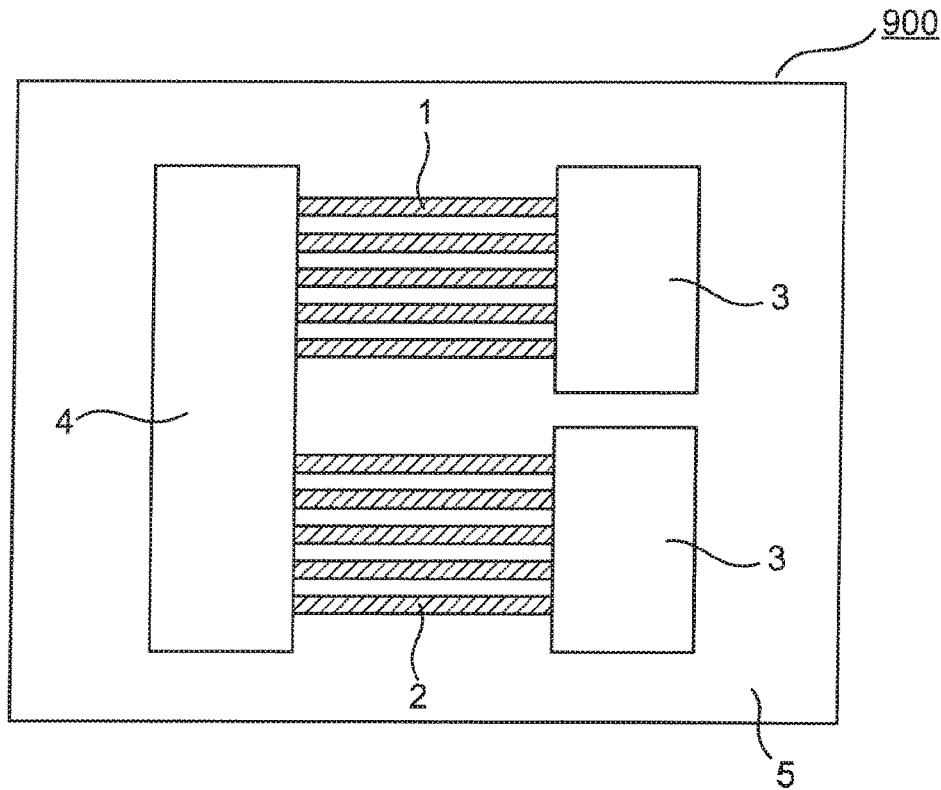
FIG. 13A is a top view of one pixel of an electromagnetic wave detector according to a tenth embodiment of the present invention.

FIG. 13A is a top view of an electromagnetic wave detector according to a tenth embodiment of the present invention, generally indicated by 900. In FIG. 13A, the same reference symbols as in FIGS. 1A and 1B indicate the same or corresponding portions.

As shown in FIG. 13A, in the electromagnetic wave detector 900, a light reception graphene 1 and a reference graphene 2 are processed into a nanoribbon shape, and the other structure is the same as that of the electromagnetic wave detector 100. Note that in order to simplify the description, description of circuits other than pixels, for example, an operation circuit and a detection circuit, which are included in the electromagnetic wave detector 900, is omitted.

Figure 13B:
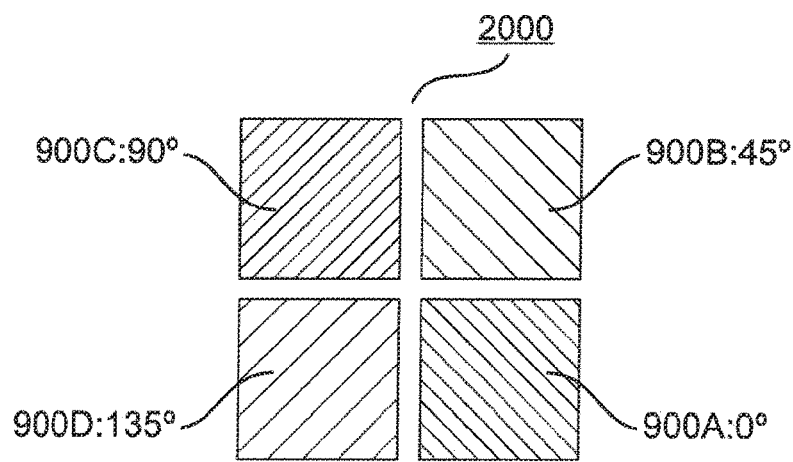
FIG. 13B is a configuration diagram of an electromagnetic wave detector array according to the tenth embodiment of the present invention.
Figure 13B:
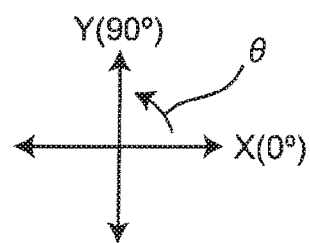

FIG. 13B is a schematic view of one unit of an electromagnetic wave detector array, generally represented by 2000, in which pixels 900A to 900D each provided with the nanoribbon-shaped light reception graphene 1 and reference graphene 2 are arranged in 2×2. Coordinates shown in a lower part of FIG. 13B are coordinates for defining a direction in which nanoribbon-shaped graphene is disposed. A longitudinal direction (left and right direction in FIG. 13A) of the nanoribbon in case of an X axis direction is 0°, and a direction of the nanoribbon is indicated by a counterclockwise angle θ. For example, B is 90° in a direction parallel to a Y axis.

As shown in FIG. 13A, the longitudinal directions of the nanoribbon-shaped graphene of the pixels 900A, 900B, 900C, and 900D are directions of 0°, 45°, 90°, and 135°, respectively. Here, in the pixel 900A in which θ is 0°, a dimension (width) in a Y direction of the nanoribbon is about 100 μm at most. As described above, by making the graphene into the nanoribbon shape, electron density of the graphene is modulated, and selective detection of polarized light becomes possible.

Next, polarization imaging using one unit 2000 of the electromagnetic wave detector array according to the tenth embodiment will be described. Here, as shown in FIG. 13B, the polarization imaging is a technique in which, in the unit 2000 having four pixels 900A, 900B, 900C, 900D with θ of 0°, 45°, 90°, 135° different from one another, an image is taken for each of four polarization angles, and a difference is determined to reflect a relative polarization distribution on the image.

In order to obtain a polarization imaging image, first, differences in sensor output among the pixels 900A, 900B, 900C, and 900D are obtained. The difference is obtained between basic vectors. For example, in a case of the pixel 900A in which θ is 0°, a difference between the pixel 900A and the pixel 900C in which θ is 90° is obtained, and in a case of the pixel 900B in which θ is 45°, a difference between the pixel 900B and the pixel 900D in which θ is 135° is obtained. These differences are called Stokes parameters. Also, instead of the difference, Degree of Linear Polarization (DoLP) may be calculated from each Stokes parameter.

In order to realize the polarization imaging, four pixels 900A, 9008, 900C, and 900D with θ of 0°, 45°, 90°, and 135° are used as one unit 2000. By arraying the unit 2000, an image sensor is formed. Also, instead of four pixels, even when a pair of two pixels having θ of 0° and 90° (900A, 900C) or a pair of two pixels having θ of 45° and 135° (9008, 900D) are formed as one unit, the polarization imaging can be realized.

Thus, to realize the polarization imaging with the graphene nanoribbons, as shown in FIG. 13B, the nanoribbons may be disposed such that θ is 0°, 45°, 90°, and 135° to form the pixel unit 2000. In the electromagnetic wave detector array using such a pixel unit 2000, polarization imaging can be performed by the graphene in a wide band such as an ultraviolet region to a radio wave region. In particular, as in the case of the electromagnetic wave detector 100 according to the first embodiment, a dark current can be reduced to zero by using a pn differential structure using the light reception graphene 1 and the reference graphene 2, so that highly accurate polarization imaging can be realized.

Eleventh Embodiment

Figure 13C:
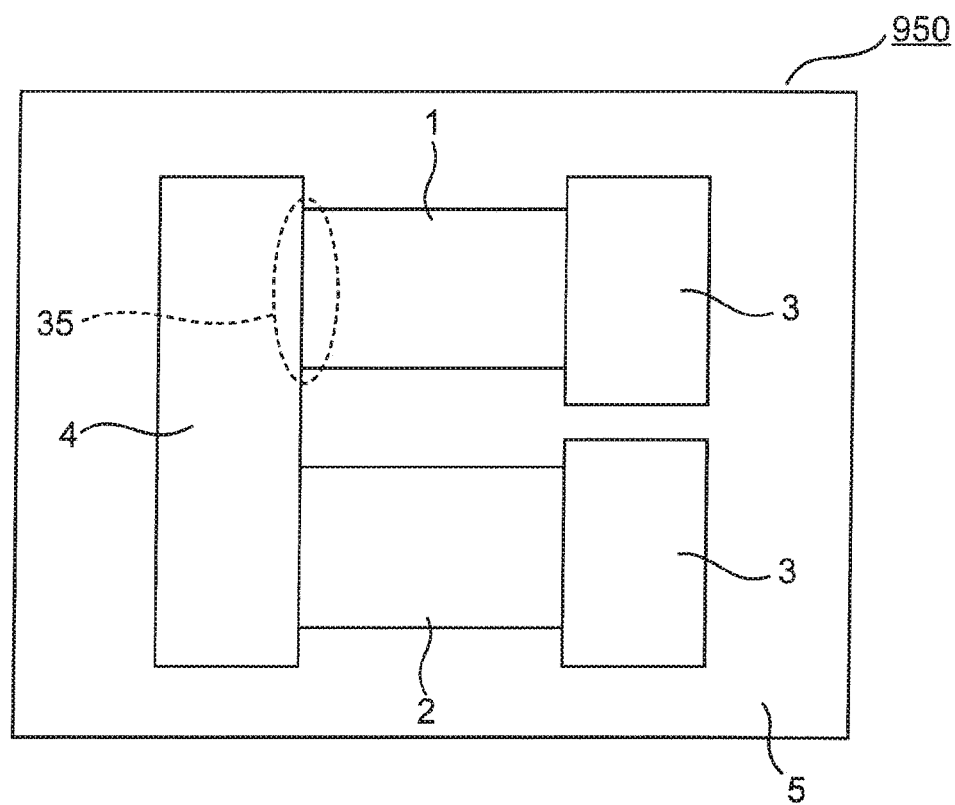
FIG. 13C is a top view of one pixel of another electromagnetic wave detector according to the eleventh embodiment of the present invention.

FIG. 13C is a top view of an electromagnetic wave detector according to an eleventh embodiment of the present invention, which is generally denoted by 950. In FIG. 13C, the same reference symbols as in FIGS. 1A and 1B indicate the same or corresponding portions.

Note that, in the eleventh embodiment, in order to simplify the description, it is assumed that one pixel is represented by a set of a light reception graphene 1 and a reference graphene 2 and that other circuits such as an operation circuit are incorporated in one pixel.

When graphene is used for a photodetector, a region contributing to photoelectric conversion is known to be dominated by an interface between the graphene and an electrode, which is denoted by 35 in FIG. 13C. Also, in FIG. 13C, a direction of the interface, that is, a direction of ends of electrodes 3 and 4 in portions where the electrodes 3 and 4 intersect the light reception graphene 1 and the reference graphene 2, is a 90° direction (up and down direction) of the coordinates in FIG. 13B.

In an electromagnetic wave detector such as a graphene transistor, for example, silicon oxide ($SiO_2$), aluminum oxide ($Al_2O_3$), silicon nitride (SiN), hafnium oxide ($HfO_2$), or boron nitride (BN) is used for an insulating layer 5 under the light reception graphene 1 and the reference graphene 2. These insulating materials absorb an electromagnetic wave in the vicinity of 10 μm, which is an infrared wavelength band, and generate heat by this absorption. This heat generation causes graphene in a channel to form a thermal gradient depending on a distance from the electrode. When heat distribution occurs in the graphene, as in a case of a thermocouple, a thermopower effect occurs, and an electromagnetic wave response is obtained.

Furthermore, in the absorption of the electromagnetic wave, an electric field perpendicular to the direction of the interface 35 (in FIG. 130, an electromagnetic wave having polarized light having an electric field in a 0° direction) is selectively absorbed. In other words, as described in the tenth embodiment, in the infrared wavelength band, the graphene transistor has polarization dependence. Therefore, polarization imaging similar to that of the tenth embodiment can be realized by arranging four pixels whose direction of the interface 35 is 0°, 45°, 90°, and 135° as one unit.

By using a thermoelectromotive effect of the graphene and the polarization dependence of absorption of the insulating layer 5 at the interface 35, polarization detection can be selectively performed in the infrared wavelength band. Graphene has high response speed, so high-performance polarization imaging can be realized. Further, since the present effect is centered on the wavelength band near 10 μm, it is possible to selectively detect polarization of only a thermal infrared wavelength without using a special wavelength selection filter or a polarizer.

Note that the absorption wavelength can be changed to a wavelength different from the absorption wavelength of the material itself by providing a recess/protrusion in the insulating layer 5 or forming a multilayer film of graphene. Thereby, the wavelength band in which polarization imaging is effective can be changed to a wavelength band other than the infrared wavelength. A recess/protrusion structure includes one-dimensional or two-dimensional periodic recesses or protrusions, such as a photonic crystal. A shape of the recess or the protrusion includes a circle, a square, a rectangle, other polygons, or any fractal structure. Moreover, by using a nitride producing plasmon resonance like TiN as a material of the insulating layer 5, it is also possible to produce an absorption effect in visible light and near infrared light.

Twelfth Embodiment

Figure 14:
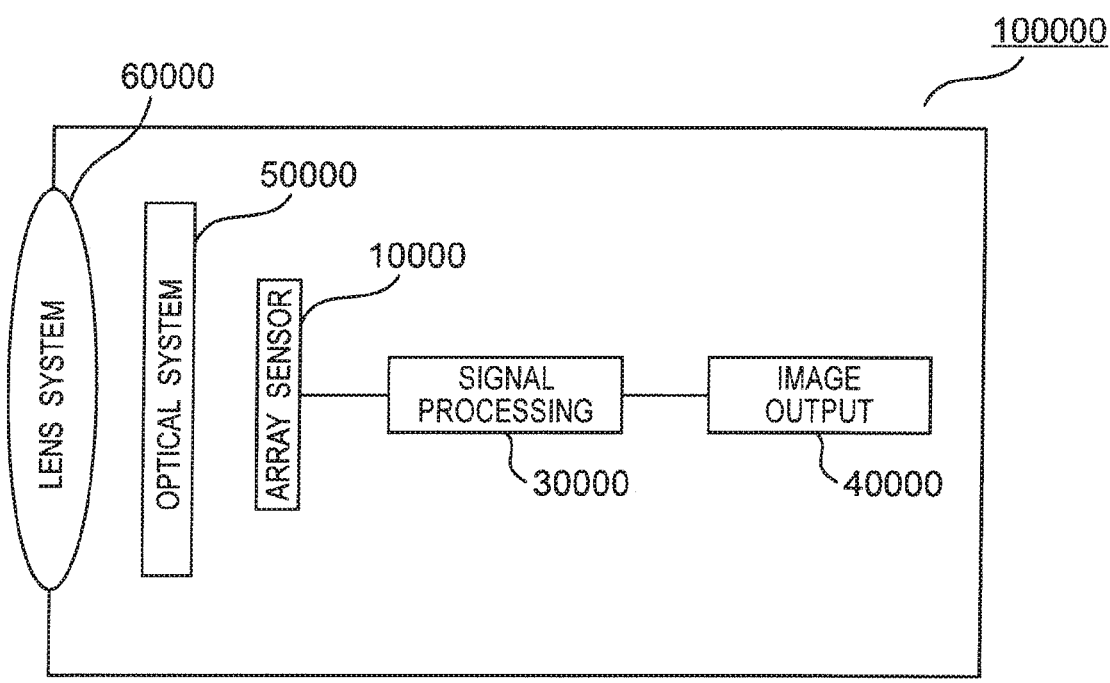
FIG. 14 is a conceptual diagram of a camera system according to a twelfth embodiment of the present invention.

FIG. 14 is a schematic view of a camera system according to a twelfth embodiment of the present invention, which is generally represented by 100000. The camera system 100000 includes an electromagnetic wave detector array 10000 or an electromagnetic wave detector array 20000. A signal processing system 30000 and an image output device 40000 are connected to the electromagnetic wave detector array 10000 or 20000. The camera system 100000 also includes a lens system 60000 and an optical system 50000 such as a shutter, an aperture, and a filter.

In the camera system 100000, an input electromagnetic wave is collected by the lens system 60000 and input to the electromagnetic wave detector array 10000 via the optical system 50000. An output signal obtained from the electromagnetic wave detector array 10000 is processed by the signal processing system 30000 and output as an image from the image output device 40000. The lens system 60000 may switch between a visible lens, a near infrared lens, an infrared lens, a terahertz lens, and the like as needed. By switching the lenses, light of various wavelengths can be input to the electromagnetic wave detector array 10000 without a filter. At this time, the shutter, the aperture, the filter, or the like may or may not be used as the optical system 50000 as necessary. Further, when the lens system 60000 is not used or when an ultra-wide band lens is used as the lens system 60000, it is possible to detect with the electromagnetic wave detector array of all wavelength bands.

Also, a metamaterial lens may be used for the lens system 60000. A metamaterial lens is a lens in which transmission of light as well as a focal distance can be adjusted in a structure by providing a periodic structure (including a pseudo periodic structure in which an arranged structure is different) on a surface. A wavelength to be transmitted can be selectively controlled by controlling the structure without depending on a material to be transmitted. In addition, it is possible to realize an ultra-wide band lens that can condense light of all wavelengths at the same focal distance.

Thirteenth Embodiment

Figure 15A:
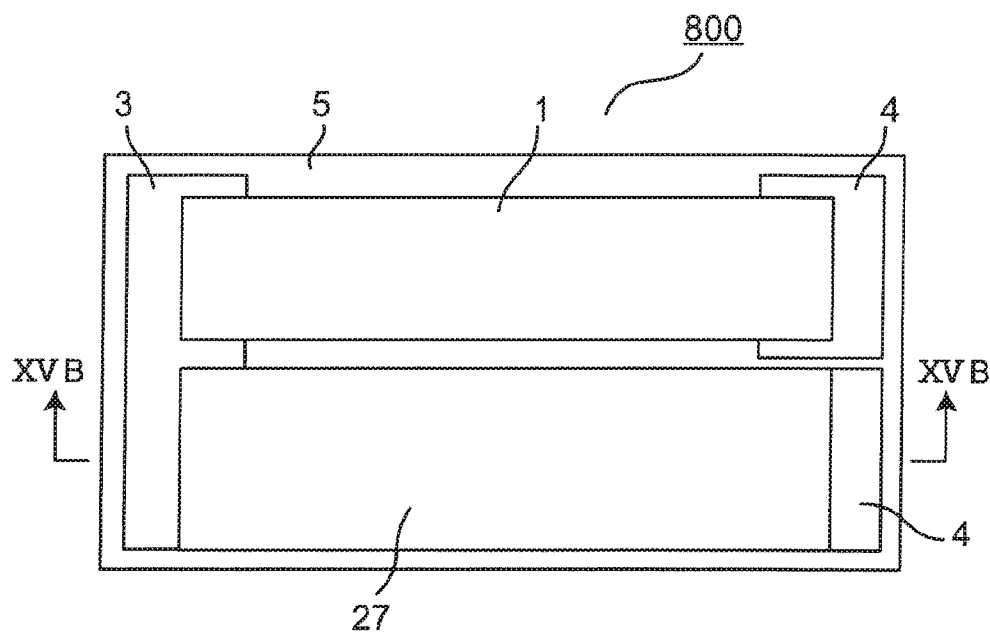
FIG. 15A is a top view of an electromagnetic wave detector according to a thirteenth embodiment of the present invention.
Figure 15B:
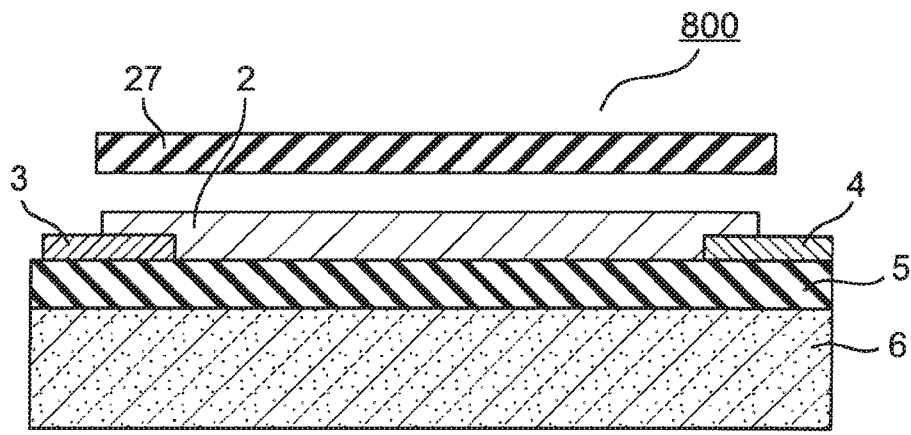
FIG. 15B is a sectional view of the electromagnetic wave detector according to the thirteenth embodiment of the present invention as viewed in a XVB-XVB direction.

FIG. 15A is a top view of an electromagnetic wave detector according to a thirteenth embodiment of the present invention, generally indicated by 800, and FIG. 15B is a sectional view of the electromagnetic wave detector 800 of FIG. 15A as viewed in a XVB-XVB direction. In FIGS. 15A and 15B, the same reference symbols as in FIGS. 1A and 1B indicate the same or corresponding portions.

The electromagnetic wave detector 800 according to the thirteenth embodiment of the present invention is different from the electromagnetic wave detector 100 according to the first embodiment in that, as shown in FIG. 15A, in the electromagnetic wave detector 800, a light shielding portion 27 made of a material capable of shielding an electromagnetic wave of a detection wavelength is provided on a reference graphene 2. The light shielding portion 27 is disposed in an optical path of an electromagnetic wave incident on the reference graphene 2 so as to block the electromagnetic wave. Thereby, the electromagnetic wave of the detection wavelength can be shielded by the light shielding portion 27. As a result, when an electromagnetic wave is detected, it is only necessary to set resistivity of the light reception graphene 1 and the reference graphene 2 to be the same, and is not necessary to adjust a gate voltage for Pauli blocking the electromagnetic wave. Balancing operation between a light reception graphene 1 and the reference graphene 2 is simplified.

Moreover, in the electromagnetic wave detector 100 according to the first embodiment, a response from visible light or the like having no difference in absorptivity cannot be detected because the response is canceled. However, in the electromagnetic wave detector 800 according to the thirteenth embodiment, when the electromagnetic wave is irradiated, the reference graphene 2 covered with the light shielding portion 27 does not show a response, and the light reception graphene 1 has sensitivity at all wavelengths other than a Pauli blocking wavelength, so that wide band electromagnetic waves including visible light can be detected.

Fourteenth Embodiment

Figure 16A:
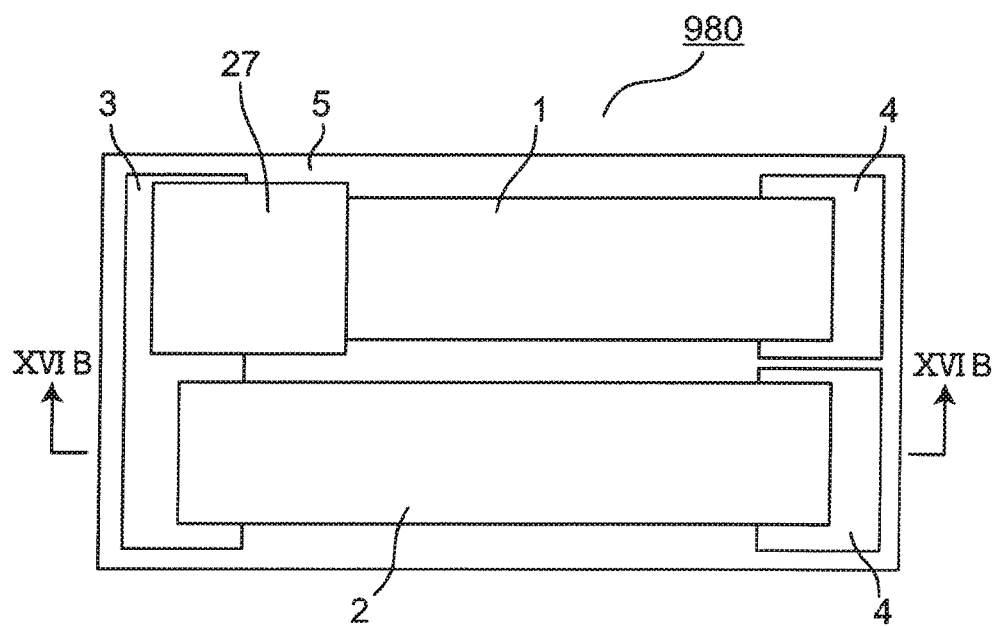
FIG. 16A is a top view of an electromagnetic wave detector according to a fourteenth embodiment of the present invention.
Figure 16B:
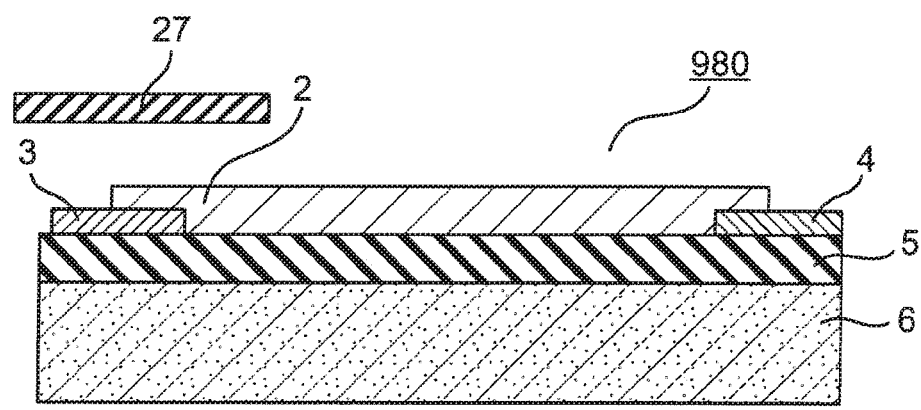
FIG. 16B is a sectional view of the electromagnetic wave detector in FIG. 16A as viewed in a XVIB-XVIB direction.

FIG. 16A is a top view of an electromagnetic wave detector according to a fourteenth embodiment of the present invention, generally represented by 980, and FIG. 16B is a sectional view of the electromagnetic wave detector 980 in FIG. 16A when viewed in a XVIB-XVIB direction. The electromagnetic wave detector 980 according to the fourteenth embodiment of the present invention differs from the electromagnetic wave detector 100 according to the first embodiment in that, as shown in FIGS. 16A and 16B, a light shielding portion 27 is provided in an optical path of an electromagnetic wave incident on either one of interfaces between a light reception graphene 1 and the electrode 3 or 4.

Generally, in a graphene transistor, photoelectric conversion of graphene has the largest contribution to an interface region between an electrode and the graphene, and the interface between the graphene and the electrode is irradiated with an electromagnetic wave, whereby electron-hole pairs are efficiently formed. Since a common graphene transistor has a symmetrical structure, a photocurrent due to electron-hole pairs generated at an interface between a source electrode/a drain electrode and graphene is canceled and attenuated between a source and a drain. Therefore, by shielding the interface between either one of the source electrode and the drain electrode and the graphene, a left-right asymmetric structure is obtained, and the photocurrent can be increased.

Therefore, in the electromagnetic wave detector 980 according to the fourteenth embodiment of the present invention, as shown in FIG. 16A, the light shielding portion 27 is provided so that the light reception graphene 1 is left-right asymmetric. Accordingly, a photocurrent flowing in the light reception graphene 1 can be amplified. In FIGS. 16A and 16B, the light shielding portion 27 is provided at the interface between the electrode 3 and the light reception graphene 1, but the light shielding portion 27 may be provided at the interface between the electrode 4 and the light reception graphene 1. Further, FIGS. 16A and 16B show one example, and a position where the light shielding portion 27 is provided varies depending on a doping level of graphene and positive and negative of a Dirac point shifted by an incident electromagnetic wave wavelength. Accordingly, the light shielding portion may be provided so that the photocurrent is appropriately increased.

With respect to a source/drain current in each graphene transistor, the light shielding portion may be provided so as to increase the photocurrent positively when the photocurrent is increased positively by electromagnetic wave irradiation, and may be provided so as to increase the photocurrent negatively when the photocurrent is increased negatively. When only one graphene is used, the light shielding portion may simply be provided to increase the photocurrent. In addition, since a light shielding range of the light shielding portion is different depending on size and a shape of a graphene channel, the light shielding portion may be provided such that the photocurrent generated due to the asymmetry of the graphene transistor is increased most. For example, a shape that shields a portion other than the interface between one of the electrodes and the graphene may be used.

DESCRIPTION OF REFERENCE SYMBOLS

1 LIGHT RECEPTION GRAPHENE
2 REFERENCE GRAPHENE
3, 4 ELECTRODE
5 INSULATING LAYER
6 SUBSTRATE
7 DETECTION CIRCUIT
8 BALANCE CIRCUIT
9 OPERATION CIRCUIT
10 DIFFERENTIAL AMPLIFIER CIRCUIT
100 ELECTROMAGNETIC WAVE DETECTOR

The invention claimed is:

1. An electromagnetic wave detector for converting an electromagnetic wave of a predetermined detection wavelength into an electric signal and detects the electric signal, comprising:
   a substrate; and
   an insulating layer provided on the substrate, and further comprising the following (a) or (b):
   (a) a light reception graphene and a reference graphene juxtaposed on the insulating layer;
      a first electrode and a second electrode disposed facing each other with the light reception graphene and the reference graphene interposed,
         the first electrode being one electrode electrically connected to both the light reception graphene and the reference graphene at respective first ends of the light reception graphene and the reference graphene, and
         the second electrode being two electrodes electrically connected to respective second ends of the light reception graphene and the reference graphene;
      the substrate acting as a gate electrode and applying a gate voltage for the light reception graphene and the reference graphene;
      a balance circuit connected between the two second electrodes; and
      a first detection circuit detecting electric signals between the two second electrodes,
      wherein in the light reception graphene, earners are doped, and when the electromagnetic wave having the detection wavelength is incident, photocarriers are generated by intraband transition,
      in the reference graphene, earners are doped, and when the electromagnetic wave having the detection wavelength is incident, no photocarrier is generated due to a Pauli blocking effect,
      in a first state in which the electromagnetic wave having the detection wavelength is not incident on the light reception graphene and the reference graphene, the balance circuit makes the first electrode and the second electrode have identical potential,
      in a second state in which the electromagnetic wave of the detection wavelength is incident on the light reception graphene and the reference graphene, the first detection circuit detects electric signals between the two second electrodes, and
      electric signals in the second state in which the electromagnetic wave having the detection wavelength is incident are output,
   (b) a graphene provided on the insulating layer;
      the first electrode and the second electrode disposed facing each other with the graphene interposed, the first electrode electrically connected to a first end of the graphene, and the second electrode electrically connected to a second end of the graphene;
      the substrate in the form of the gate electrode applying the gate voltage to the graphene;
      a second detection circuit detecting electric signals between the first electrode and the second electrode,
      wherein the gate voltage applied to the graphene includes:
      a first gate voltage that is applied such that photocarriers are generated by intraband transition when the electromagnetic wave having the detection wavelength is incident, and
      a second gate voltage that is applied so that no photocarrier is generated due to the Pauli blocking effect when the electromagnetic wave having the detection wavelength is incident, and further, when the electromagnetic wave having the detection wavelength is not incident, in a third state the which the first gate voltage is applied and a fourth state in which the second gate voltage is applied, the gate voltage is such that currents or voltages between the first electrode and the second electrode become identical, and
      when the electromagnetic wave having the detection wavelength is incident, a difference in the electric signals between the third state in which the first gate voltage is applied and the fourth state in which the second gate voltage is applied is output.

2. The electromagnetic wave detector according to claim 1, wherein carriers are generated by application of the gate voltage in the light reception graphene and the reference graphene.

3. The electromagnetic wave detector according to claim 1, wherein the balance circuit is a bridge circuit in which the light reception graphene, the reference graphene, and two or more resistance elements are combined or a bridge circuit in which the light reception graphene and three or more resistance elements are combined.

4. The electromagnetic wave detector according to claim 3, wherein each said resistance element is constituted by one or more elements selected from a group consisting of a semiconductor thin film transistor element, a thin film resistance element, a two-dimensional material transistor element, and a transistor element using the reference graphene.

5. The electromagnetic wave detector according to claim 1, wherein a differential amplifier circuit is used as the first detection circuit, and a differential current at a time of electromagnetic wave irradiation output from the first electrode that electrically connects the light reception graphene and the reference graphene in series is used as an input of the differential amplifier circuit.

6. The electromagnetic wave detector according to claim 1, wherein the gate electrode is provided on at least either one of the light reception graphene and the reference graphene, or at least one of on and under the insulating layer provided at least one of on and under the graphene, and a voltage is applied to the light reception graphene and the reference graphene or the graphene from the gate electrode.

7. The electromagnetic wave detector according to claim 1, further comprising: a contact layer provided on one or both of the light reception graphene and the reference graphene or on or under the graphene in contact with the light reception graphene and the reference graphene or the graphene, wherein the contact layer supplies holes or electrons to the light reception graphene and the reference graphene or the graphene.

8. The electromagnetic wave detector according to claim 7, wherein the contact layer is selected from a group consisting of quantum dots, ferroelectric materials, fullerenes, liquid crystal materials, and plasmon antennas.

9. The electromagnetic wave detector according to claim 1, wherein a light shielding portion is provided in an optical path of the electromagnetic wave incident on the reference graphene.

10. The electromagnetic wave detector according to claim 1, wherein a light shielding portion is provided in an optical path of the electromagnetic wave incident on either one of interfaces between the light reception graphene and the first electrode or the second electrode.

11. The electromagnetic wave detector according to claim 1, wherein the light reception graphene, the reference graphene, and the graphene have a single layer structure or a laminated structure of two or more layers of materials selected from a group consisting of graphene materials, graphene nanoribbon materials, and carbon nanomaterials.

12. The electromagnetic wave detector according to claim 1, further comprising: a correction circuit that detects current values or voltage values of the light reception graphene and the reference graphene when the electromagnetic wave having the detection wavelength is not incident, and corrects the current values or the voltage values as needed so that the light reception graphene and the reference graphene to have an identical resistance value.

13. An electromagnetic wave detector array in which the electromagnetic wave detector according to claim 1 is set as one pixel, and the pixels are arranged in an array shape.

14. The electromagnetic wave detector array according to claim 13, wherein four electromagnetic wave detectors different in a longitudinal direction of the light reception graphene and the reference graphene or the graphene respectively by 45° are set as pixels and arranged in an array shape.

15. An electromagnetic wave detection method, in which a first transistor having a first channel of light reception graphene in which earners are doped such that photocarriers are generated by intraband transition when irradiated with an electromagnetic wave having a predetermined detection wavelength, and a second transistor having a second channel of a reference graphene in which carriers are doped such that no photocarrier is generated due to Pauli blocking when irradiated with the electromagnetic wave having the detection wavelength, the first and second transistors are connected in series, and electric signals at both ends of each of the first channel of the light reception graphene and the second channel of the reference graphene are detected, comprising:

applying a gate voltage to the first transistor and the second transistor in a first state in which the electromagnetic wave having the detection wavelength is not incident on the light reception graphene and the reference graphene, and controlling a first resistance value of the first channel of the light reception graphene and a second resistance value of the second channel of the reference graphene so as to become identical;

detecting the electric signals in the first state in which the electromagnetic wave having the detection wavelength is not incident on the light reception graphene and the reference graphene;

detecting the electrical signals in a second state in which the electromagnetic wave having the detection wavelength is incident on the light reception graphene and the reference graphene; and obtaining and outputting a difference in the electric signals between the second state in which the electromagnetic wave having the detection wavelength is incident and the first state in which it is not incident.

16. An electromagnetic wave detection method for detecting electric signals at both ends of a transistor in which a doping level of a channel of a graphene is controlled by a gate voltage, comprising:

controlling the gate voltage to a first gate voltage so that photocarriers are generated by intraband transition when an electromagnetic wave having a detection wavelength is incident and controlling the gate voltage to a second gate voltage so that no photocarrier is generated due to a Pauli blocking effect when the electromagnetic wave having the detection wavelength is incident; further, equalizing currents or voltages between a first electrode and a second electrode in a first state in which the first gate voltage is applied and a second state in which the second gate voltage is applied when the electromagnetic wave having the detection wavelength is not incident; and obtaining a first difference in the electric signals in a first case of the first gate voltage and a second difference in the electric signals in a second case of the second gate voltage between a first state in which the electromagnetic wave having the detection wavelength is incident and a second state in which it is not incident, and obtaining and outputting a sum of the first and second differences.

17. The electromagnetic wave detection method according to claim 15, wherein each said electric signal is a current or a voltage.

18. The electromagnetic wave detection method according to claim 16, wherein each said electric signal is a current or a voltage.

* * * * *